US009501494B2

United States Patent
Zhirkov et al.

(10) Patent No.: US 9,501,494 B2
(45) Date of Patent: Nov. 22, 2016

(54) MULTI-STRUCTURAL, MULTI-LEVEL INFORMATION FORMALIZATION AND STRUCTURING METHOD, AND ASSOCIATED APPARATUS

(71) Applicant: GENERAL HARMONICS INTERNATIONAL INC., Providenciales (TC)

(72) Inventors: Alexander Zhirkov, West Vancouver (CA); Alexey Oraevsky, West Vancouver (CA); Andrei Grichine, West Vancouver (CA); George Blondheim, West Vancouver (CA); Max Wandinger, West Vancouver (CA); Wade Attwood, West Vancouver (CA)

(73) Assignee: General Harmonics International, Inc., Providenciales (TC)

( * ) Notice: Subject to any disclaimer, the term of this patent is extended or adjusted under 35 U.S.C. 154(b) by 317 days.

(21) Appl. No.: 14/182,968

(22) Filed: Feb. 18, 2014

(65) Prior Publication Data

US 2014/0164454 A1    Jun. 12, 2014

Related U.S. Application Data

(63) Continuation of application No. PCT/CA2012/050562, filed on Aug. 16, 2012.

(60) Provisional application No. 61/525,629, filed on Aug. 19, 2011, provisional application No. 61/588,101, filed on Jan. 18, 2012.

(51) Int. Cl.
G10L 19/00 (2013.01)
G06F 17/30 (2006.01)
(Continued)

(52) U.S. Cl.
CPC ...... G06F 17/30221 (2013.01); G10H 1/0008 (2013.01); G10L 19/0017 (2013.01);
(Continued)

(58) Field of Classification Search
CPC .................................................. G06F 17/30221
See application file for complete search history.

(56) References Cited

U.S. PATENT DOCUMENTS 5,742,930 A * 4/1998 Howitt ................... G10L 19/00
704/214
6,178,405 B1    1/2001 Ouyang et al.
(Continued)

FOREIGN PATENT DOCUMENTS

CN    1527306 A    9/2004
WO    9823039 A1    5/1998

OTHER PUBLICATIONS

Chinese Office Action dated Nov. 26, 2015 for Application No. 201280051716.3.
(Continued)

*Primary Examiner* — Douglas Godbold
(74) *Attorney, Agent, or Firm* — Womble Carlyle Sandridge & Rice LLP

(57) ABSTRACT

Systems and methods for structuring information include determining information quantity (IQ) and information value (IV) in an original digital information file (ODIF). An initial manipulation process applied to the ODIF forms a first resulting DIF (FRDIF), and a subsequent manipulation process applied to the FRDIF forms a second resulting DIF, wherein each manipulation process removes at least one element of the processed DIF and/or represents an element combination with a representative element and a first indicia of an interrelationship between the representative element and one or more elements in the combination, to reduce the IQ of the processed DIF, while retaining the IV thereof within a threshold. Manipulation processes are successively applied to the previously resulting DIF until successive applications do not achieve a threshold reduction in IQ. The last resulting DIF has a primary structure with a reduced IQ and an IV within the threshold of the original IV.

26 Claims, 12 Drawing Sheets

(51) Int. Cl.
*H03M 7/30* (2006.01)
*G10H 1/00* (2006.01)

(52) U.S. Cl.
CPC ........ *H03M 7/55* (2013.01); *G10H 2240/091* (2013.01); *G10H 2240/181* (2013.01); *G10H 2240/325* (2013.01); *G10H 2250/225* (2013.01); *G10H 2250/571* (2013.01)

(56) References Cited

U.S. PATENT DOCUMENTS

| | | | |
|---|---|---|---|
| 6,223,162 B1 | 4/2001 | Chen et al. | |
| 6,404,898 B1 * | 6/2002 | Rhoads | H04N 5/90 380/287 |

OTHER PUBLICATIONS

Ronald R Coifman et al., "Entropy-Based Algorithms for Best Basis Selection", IEEE Transactions on Information Theory, vol. 38, No. 2, Mar. 1992, pp. 713-718.

Anonymous: "Wavelet package decomposition—Wikipedia, the free encyclopedia", Aug. 11, 2011, XP055191664.

Frank Kurth et al, "M-Band Wavelet Packets and Filter Bank Trees as Flexible Tools in Audio Signal Processing", Oct. 19, 1997, XP010248210.

Supplementary European Search Report dated Jun. 10, 2015 for Application No. 12825060.2.

* cited by examiner

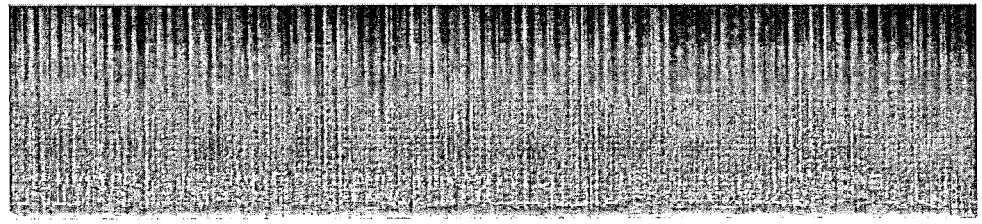

SAMPLE OF STANDARD ORIGINAL SPECTRUM
FIG. 2A

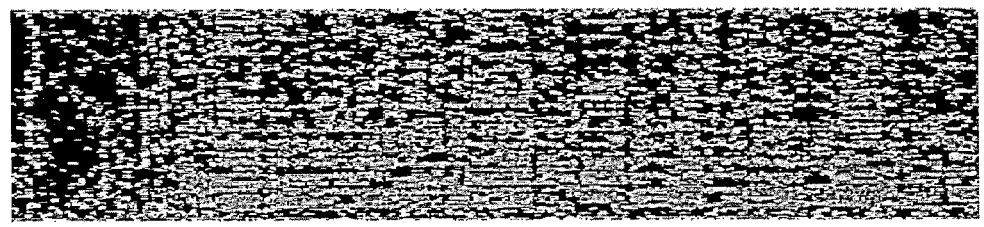

INFORMATION DIAGRAM OF HARMONIC PRIMOTRONS FOR THE SAME COMPOSITION*
FIG. 2B

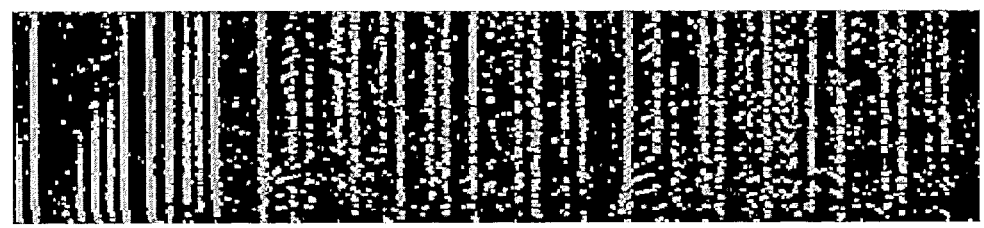

INFORMATION DIAGRAM OF HIT PRIMOTRONS FOR THE SAME COMPOSITION*
FIG. 2C

*INFORMATION SOUND INFORMATION PRIMOTRONS VISUALIZATION. PARTICULAR NON-BLACK AREAS ARE PRIMATRONS THAT SATISFY PIC CRITERIA. BLACK REGIONS DON'T BELONG TO PRIMATRONS SET. OTHER NON-BLACK AREAS MAY REQUIRE MORE DETAILED ANALYSIS.

MULTI-STRUCTURAL, MULTI-LEVEL INFORMATION FORMALIZATION AND STRUCTURING METHOD, AND ASSOCIATED APPARATUS

CROSS-REFERENCE TO RELATED APPLICATIONS

This application is a continuation of International Application No. PCT/CA2012/050562, filed Aug. 16, 2012, which International Application was published by the International Bureau in English on Feb. 28, 2013, and claims the benefit of U.S. Provisional Application Nos. 61/525,629 and 61/588,101 filed on Aug. 19, 2011 and Jan. 18, 2012, respectively, which are herein incorporated herein by reference in their entirety and for all purposes.

BACKGROUND OF THE DISCLOSURE

Field of the Disclosure

Aspects of the present disclosure relate to information processing to achieve for and structuring, including audio analysis, manipulation, and representation, and, more particularly, to systems and methods of structured analysis and relationship determination between information value and information quantity as related to harmonically-configured data, including digital media.

Description of Related Art

A generally-recognized standard for the concept of unified audio or other digital data formalization may not be generally available in the art, though various techniques may be implemented to accomplish the same. For example, some techniques employ simplified audio representations of a sound signal, which primarily include speech recognition and speech synthesis as well as compression of digital data representing music. In one aspect, speech technologies have progressed from representing sound signals through the corresponding waveform, though such techniques often function on the basis of words or even entire phrases in the speech data. Such a basis in words/phrases represents a form of information which is closer to the natural perception of the human brain. In contrast, formalization technologies implemented for music representation generally use only a physically perceptive representation of information, i.e., in the form close to that of the physical perception of sound by the human ear.

To date, other attempts at a more abstract universal representation of music remain largely unsuccessful. Such lack of success may be attributed, for example, to the fact that speech information includes a form of primary language and syntax of its description, engineered with precise mathematics which have been established and fine tuned by many generations. In contrast, the existing representations of music, for example, based on notes or sound samples, are relatively primitive as compared to speech information analysis and any such representations are generally not universally applicable.

In this regard, one of the relatively more informative digital representations of sound currently available may be the PCM format, generally referred to as uncompressed audio. However, even though such a format may be relatively more informative, such informativeness is offset by a relatively large data file size. The large data file size, in turn, may render such a format or representation unsuitable or impracticable, for example, for fast delivery/transmission and/or compact storage. If such attributes are desired, more compact, though likely less informative, representations have been or are being developed that generally employ a popular approach to data reduction, such as used, for example, in MP3, OGG, WMA and other classic psychoacoustic models or representations. However, natural sounds include more redundancy than such typical audio signal representations/models are capable of effectively analyzing. Further, human perception of music is generally far more complex than any existing psychoacoustic model. As such, there exists a need for an improved approach to sound formalization that is capable of representing sound, audio, music, and/or any other harmonics-related digital data in a more compact (i.e., less data intensive), yet more informative manner (i.e., in terms of the completeness of the representation that may be provided).

In efforts to satisfy this demand, more progressive representations/models have been developed which are currently being employed, for example, in MP3-Pro, HE AAC, MP3 PlusV, MPEG-4 SSC, MPEG 4 structured audio, and MIDI. MP3-Pro and HE AAC essentially use peculiarities of human perception as the basis for extracting structure elements in an audio signal, without preserving specific phase and similarity search in the signal. Low frequencies are replicated onto high frequencies, without preserving the phase, but retaining the similarity principle and general sound parameters, such as conservation of energy and the chaotic nature of the signal. MP3-PlusV extracts, stores and generates harmonics, without preserving the phase, and may also be applied for determining the high frequency part of the signal. MPEG-4 SSC (Sinusoidal Coding) is a method of representing the signal as a set of organized objects, such as harmonics, hits and noise. However, such a method of extracting those objects from the signal is dissimilar to the perception scheme naturally occurring with the human brain. Therefore, reproduction of the signal from this representation/model may include undesirable artifacts. MPEG-4 Structured Audio attempts to represent sound by a unified algorithm that is capable of generating a variety of sound structures. While this approach may have some potential, the creation of such an algorithm may be problematic due to the required computational resources. MIDI format usually requires a relatively smaller data file size, but, similarly to MPEG-4 Structured Audio, is a representation/model that is generally suitable for manual writing of music, and not for representation of naturally occurring sounds and/or already-created audio compositions.

Thus, while becoming more advanced in efforts to reduce or eliminate inherent perceptive redundancy in an audio signal, as compared to classic psychoacoustic methods or models, existing structured and object-oriented sound representations/models may tend to lose the scope of informativeness of the initial signal at a low bit rate (i.e., high information quantity), and thereby fail to preserve the quality of the original audio signal with an acceptable degree of tolerance, as the sound representation/model produces a more compact data file size. Accordingly, there exists a need for a formalization scheme and arrangement for digital media, such as audio, that is capable of reducing the information quantity or bit rate of a digital information file by appropriate structuring, while retaining an information value within a threshold of or even greater than the original digital information file.

BRIEF SUMMARY OF THE DISCLOSURE

The above and other needs are met by aspects of the present disclosure, wherein one such aspect relates to the use of highly-organized structures and parameters as audio signal metrics only. Another aspect includes a method of successive growth of a variety of sound structures from information primotrons or other data elements to create complex, yet more compact (with respect to data file size), information-rich structures. Higher order level structures consist of sound information primotrons which may be time-localized, frequency-localized, or have hybrid (i.e., time-frequency) localization, wherein such information primotrons may facilitate evolution or creation of higher order sound or other media structures, including phonemes for speech signals. Time-localized primotrons may generate attacks and hits, and higher level rhythm (with respect to audio), while frequency-localized primotrons are the origin of harmonics, a higher level overtone model, and higher level recurrent melodies. Yet another aspect comprises organizing signal primotrons into time-frequency clusters for further classification and analysis. Still another aspect of the present disclosure is directed to the concurrent use of a number of self-adaptive audio formalization analysis methods to generate a Sound Structure Construction Domain (SSCD) for each time-frequency cluster, at every level of information hierarchy and with a desired degree of tolerance of the original digital information file. Additional aspects of the present disclosure are directed to applications of such a sound/audio formalization technique realized by the relatively high level of informativeness in combination with the relatively low data file size afforded by aspects of the disclosed technology.

As used herein, a "primotron" can be defined as primary representative data elements or structures including multi-structural, multi-level (MSML) objects or entities for the digital formalization of media such as sound or audio, which can be used to create complex, yet more compact (with respect to data file size), information-rich structures. Higher order level structures of sound information primotrons may be time-localized, frequency-localized, or have hybrid (i.e., time-frequency) localization. Time-localized primotrons may generate attacks and hits, and higher level rhythm (with respect to audio), while frequency-localized primotrons are the origin of harmonics, a higher level overtone model, and higher level recurrent melodies. Generally, a primotron, determined by aspects of a formalization method as disclosed herein, represents a pattern or combination of one or more bits or data elements in the various levels and/or dimensions of the bit matrix of the digital audio file, and it follows that the digital audio file can subsequently be represented by a combination of such primotrons identified and/or otherwise determined to be included therein. The evolution or "life history" of such patterns may be further characterized by principles of information evolution in a dynamic chaotic system defined by a finite number of structures, namely primotrons each having a "lifetime" which may vary from a fraction of a second to several minutes within the time or time-frequency duration of the digital audio file. Because the digital audio file is now represented by such a combination or living system of primotrons, wherein each primotron represents a bit subset of the bit matrix for or other structure or entity associated with that digital audio file, the MSML audio file including the identified combination of primotrons may exhibit, for example, a reduced data file size (information quantity) as compared to the original digitized audio file (while retaining an information quality of the digital audio file within a perceptive threshold of the original digital audio file). Such primotrons may facilitate the reduction in information quantity or bit rate for the particular digital audio file, while retaining the informativeness of the digital audio file within a perceptive threshold of the original digital audio file. Accordingly, such a highly structured, multi-functional digital data format may be configured for highly compact and effective storage and playback of any material represented in a form of a harmonically-based or constructed high fidelity audio signal (including music, voice, and other rich sound-based media), within a threshold of the original digital data signal. From another perspective, aspects of the present disclosure provide systems and methods for representing a sound composition as a multi-structural, multi-level (MSML) formalization, wherein any relatively higher structure level of the sound composition may be configured as an integration of the elements of a relatively lower level of the sound composition using, for example, Perceptive Information Criteria (PIC). PIC is considered satisfied, for instance, if the perceptive information of a level is less than the sum of information values of the independent constituent elements of that level. A zero level is defined as a level in which information quantity is equivalent to "perceptive entropy." Higher order levels include sound information primotrons (or primary sound structures) which may be time-localized, frequency-localized, and/or have hybrid localization. Information privations may spawn a higher order sound structure, which may include phonemes for speech signals. Time-localized primotrons may generate attacks and hits, and higher level rhythm. Frequency-localized primotrons may be associated with the origin of harmonics, then higher level overtone models, and then higher level recurrent melodies. Once constructed, the MSML formalization of each sound composition or signal can be comprised of, morphed with or into, or otherwise combined with the MSML formalization of another sound composition or signal, thus forming more complex higher level MSML semantic structures.

More particularly, aspects of the present disclosure provide methods and systems for structuring information. Such methods and systems generally involve analyzing an original digital information file to determine an original information quantity and an original information value associated therewith. An initial manipulation process is then applied to the original digital information file to form a first resulting digital information file, and a subsequent manipulation process may then be applied to the first resulting digital information file to form a second resulting digital information file. Each manipulation process is configured to remove at least one element of the processed digital information file, and/or represent a combination of a plurality of elements of the processed digital information file with a representative element and a first indicia associated with an interrelationship between the representative element and at least one of the plurality of elements in the combination, so as to reduce the information quantity of and to structure the processed digital information file. The removed element and/or the representative element are determined to reduce the information value of the processed digital information file by no more than a selected threshold with respect to the original digital information file. Such manipulation processes are successively applied to the previously resulting digital information file until successive manipulation process applications do not achieve a threshold reduction in the information quantity in the subsequent resulting digital information file over the previously resulting digital information file. The last resulting digital information file is thereby designated as having a primary structure with a reduced information quantity with respect to the original information quantity and a resulting information value within the selected threshold of the original information value.

According to another aspect, systems and methods may be provided for bandwidth and bit rate reduction of audio data using a phaseless coding interface (manipulation process) for an MSML sound composition formalization, wherein the interface is configured to consider a perceptive information value hierarchy. The bandwidth and bit rate reduction method uses the interface to perform tasks targeting selected data reduction, while retaining informativeness or information value of all sound structures associated with the sound composition, for example, through comparison to known sound metrics. Such a method performs a comparison of different level sound objects in space, focusing on determining the integrity of the structures and the degree of degradation thereof, within a reduced quantity representation of the signal after filtration or application of a manipulation process, which facilitates selection of a proper parameter for each sound element. The phaseless coding interface is appropriately configured such that signal time dependence is not preserved, and sound structures are conserved instead of signal waveform, thus resulting in a decrease in essential bandwidth and bit rate. To achieve a higher rate of audio bandwidth and bit rate reduction, the relatively more informative level structures of the MSML sound composition formalization are configured to maintain constant parameters. The parameters of the relatively less informative level structures are saved with less accuracy or are generated during decoding with the use of random values.

According to another aspect, systems and methods may be provided for audio data structure analysis, using a structure analysis interface for an MSML sound composition formalization, for extraction of fuzzy repetitive elements from such music compositions. Such a structure analysis interface is configured to process audio data received from the original signal MSML formalization and to identify fuzzy repetitive loop elements within a relatively low level of the MSML formalization, for use in further data reduction and without lowering the overall signal informativeness. Such an interface comprises three modules. The first module provides search, positioning, and length marking of all fuzzy repetitive elements throughout the entire initial level of the MSML formalization. The second module extracts a general sound constituent for any set of fuzzy repetitive fragments and defines the level of data cohesiveness by forming a correspondent residual signal. The third module performs a predictive construction of the resultant audio fragment by integrating extracted repetitive elements, corresponding marking data, and residual information. A filtering method for phase modeling is used to minimize required initial phase information during the sound construction process. This interface is configured to be used as an element for a variety of applications, including but not limited to music search engines, music visualization, and deep audio compression technologies.

Another aspect is directed to systems and methods for audio compression using hierarchy repetitive structures in an MSML sound composition formalization. The advanced phaseless repetition coding interface utilizes structures formed by macro-repetition sound primotrons of the highest level within a meaningful MSML formalization sound hierarchy. Two types of data are used for the decoding process: large scale data that defines the general structure within the MSML formalization and data that comprises original signal fragments described by a relatively lower level model. To compress the signal fragments, a general psycho-acoustic coder can be utilized, in some instances, possibly using an outer signal masking. Bit rate reduction occurs due to the elimination of repetitive fragments constructed at the highest level of MSML formalization, while storing the locations of these fragments. Perceptive equivalence of repetitive fragments allows a reduction in the number of reference samples.

Yet another aspect is directed to systems and methods for audio bandwidth and bit rate reduction using a lossless compression interface for an MSML sound composition formalization by reducing the number of integer value arrays associated therewith through the use of an advanced entropy coder performing only integer operations, without divisions, and secondary probability estimations. Since the interface's range coder and contextual model don't use the mathematical operation of division, it allows the application of this interface to/execution of the interface by low cost microcomputers that do not have a division operation. To improve the contextual model reliability of the interface, secondary probability estimation is employed. Secondary probability estimation is a complex contextual model that utilizes predicted probability as a context to another model. 2-dimensional secondary probability estimation can also be used for mixing two different models. 2-dimensional secondary probability estimation is a modification of secondary probability estimation, which has two input probabilities and uses them as a context. Additional integer contexts can also be used.

Still another aspect is directed to systems and methods for improving compression of audio signals. Systems and methods are also provided for improving arithmetic coding and contextual modeling to increase compression ratios and processing speeds, and thereby allow spectral data to be compressed with high effectiveness and higher speed. The compression method is capable of being fully automated and does not require pre-initialization for different types of audio data. It is sufficiently flexible to adjust for different sizes of spectral audio data, permitting it to be used with different spectral transforms. Instead of a standard arithmetic coder, a more efficient range coder is used. Context modeling is applied to the data stream, constructed algorithmic models, and the algorithmic optimization of a coder and/or decoder function. This aspect is also at least partially based upon the use of adaptive range coder techniques involving increasing the probability of the value coded. To improve the contextual model reliability, a secondary probability estimation may be employed.

Other aspects involve systems and methods for efficient audio data streaming using an audio data advanced accelerator interface for an MSML sound composition formalization, and utilizing a Null Quality Loss (NQL) process to reduce the number of quantized time-frequency spectral coefficients (QMDCT), to provide faster delivery of the original audio without essential quality degradation in the resultant sound. The NQL process performs a classification of sound structures within the MSML formalization depending on the importance thereof based on the limits of human perception. The advanced accelerator interface reconstitutes quantized time-frequency spectral coefficients of the initial format, without data de-quantization or reverse transcoding via PCM format. The advanced accelerator interface divides the initially encoded file of time-frequency spectral coefficients into three groups, where coefficients from a low frequency spectral group remain unchanged, while some coefficients from an intermediate frequency group are zeroed using the NQL process, and coefficients from the third group (highest frequencies) are eliminated by replacing them with the most similar sub-groups of coefficients, stitching them into low and intermediate groups, and saving a reference to this sub-group, as well as integral factors, without affecting structural sound elements (i.e., harmonics and hits).

Systems and methods are also provided, according to yet another aspect, for reducing audio data size, using an affine transforms coding interface for an MSML sound composition formalization, while preserving full integrity of the original sound reproduction in a form of affine transform of the similar sound primotrons, which leads to a decrease in signal entropy (i.e., higher structuring). The affine interface associated with the MSML formalization is used as an addition or supplement for any audio coding procedure in order to increase the compression ratio, as well as the core compression process, for the class of the signals where time-frequency affine-similar micro-fragments bear an essential part of the sound information. This affine transforms coding interface, while used in conjunction with the MSML formalization, is configured to utilize similar spectral micro-fragments of the digital audio signal for increasing the compression ratio of the signal. During processing, the complete spectral range is split into sub-bands. A search for similar spectral fragments in the preceding part of the sound signal is performed independently and using a different step in each sub-band. Affine amplitude, time and spectral shift transform is used during the search for similar fragments. Each fragment found is subtracted from the original spectral fragment and the residual is further processed as a difference of spectral components, thus eliminating significant redundancy of spectral data.

In summary, aspects of the present disclosure provide systems and methods directed to a multiple structure, multiple level formalization of a sound or other digital media composition, as well as various systems and methods for determining a pattern and/or combination of primary objects or entities in the formalization to provide a reduced data file size as compared to the original digitized audio file (i.e., a reduced information quantity or bit rate), while retaining maximum informativeness (i.e., information quality) of the determined elements, and systems and methods for reconstructing or decoding the pattern/combination of primary objects or entities (elements) to synthesize the original sound or other digital media composition. Aspects of the present disclosure thus address the identified needs and provide other advantages as otherwise detailed herein.

BRIEF DESCRIPTION OF THE SEVERAL VIEWS OF THE DRAWINGS

Figure 1:
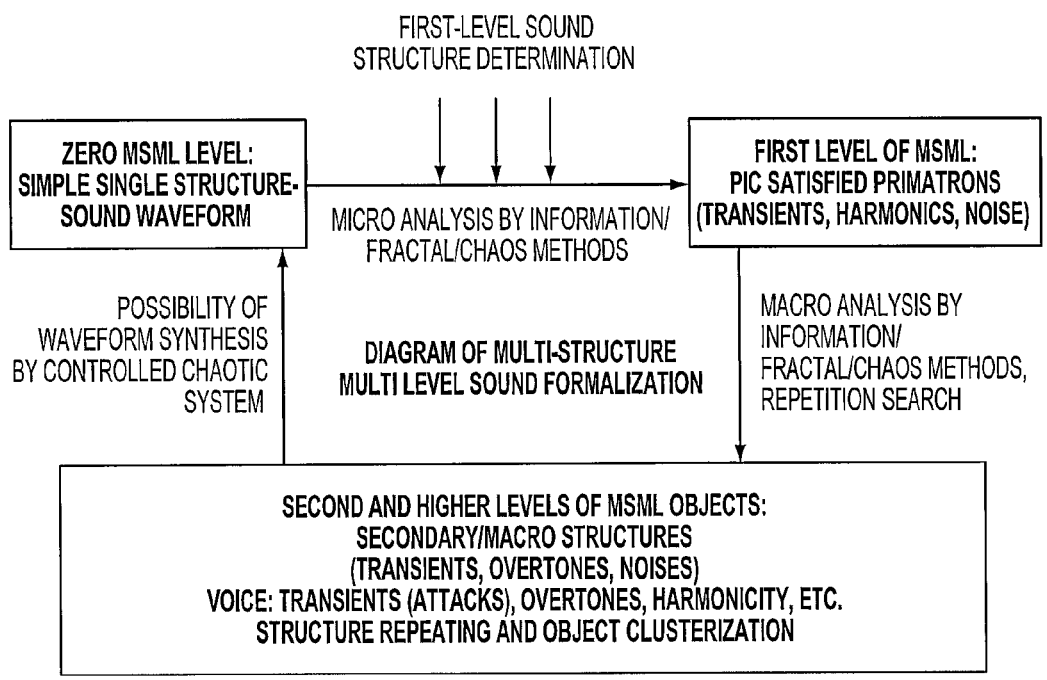
Figure 3A:
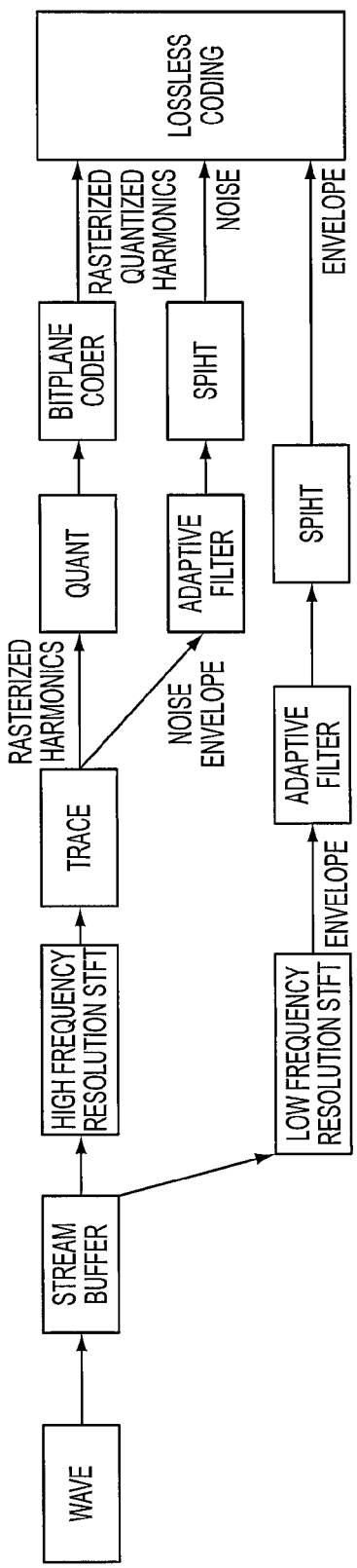
Figure 3B:
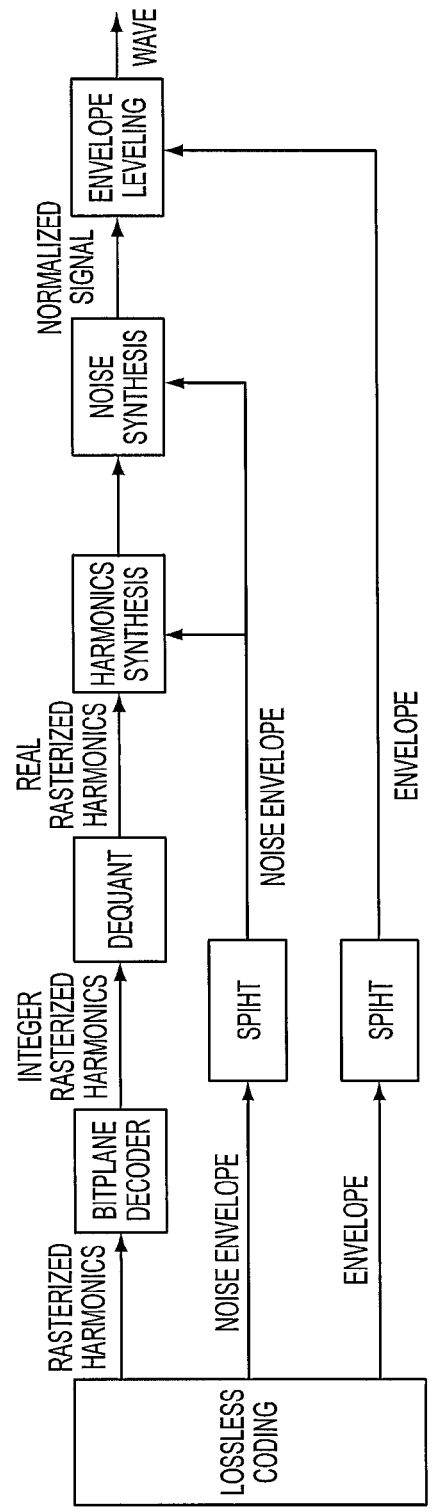
Figure 4A:
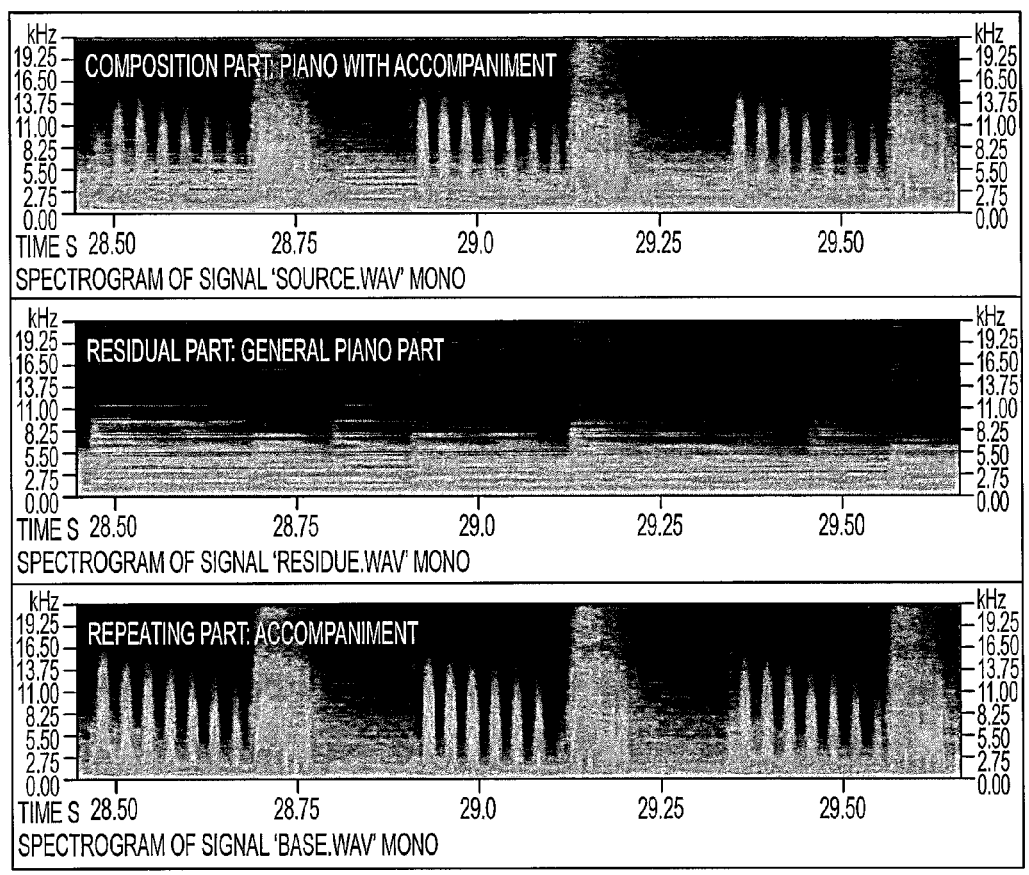
Figure 4B:
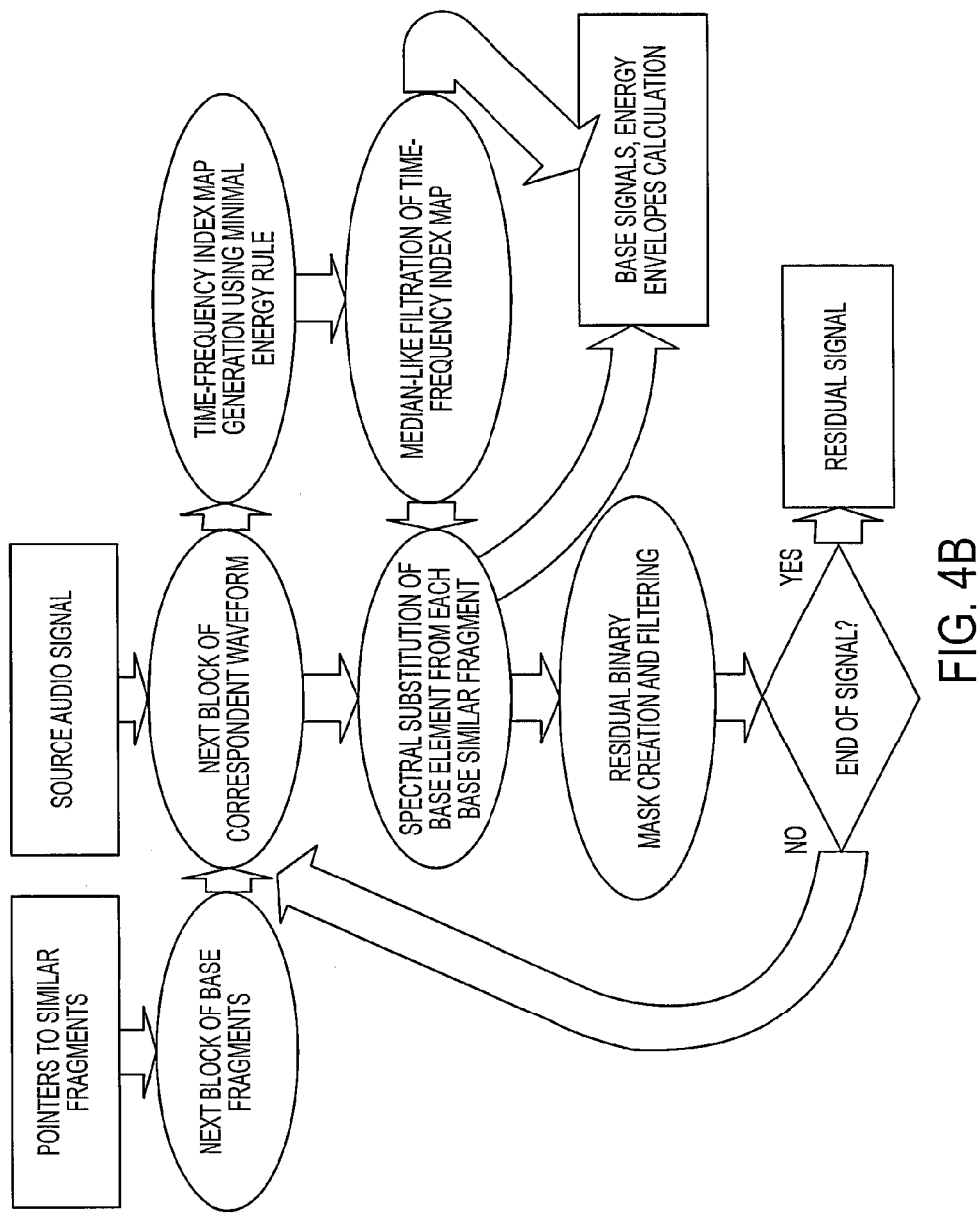
Figure 5:
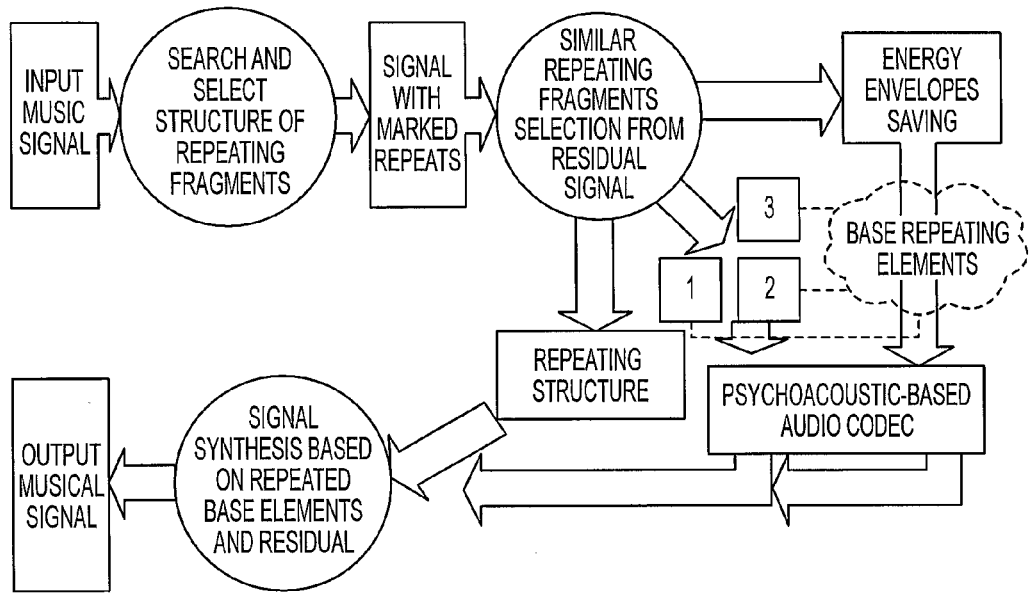
Figure 6A:
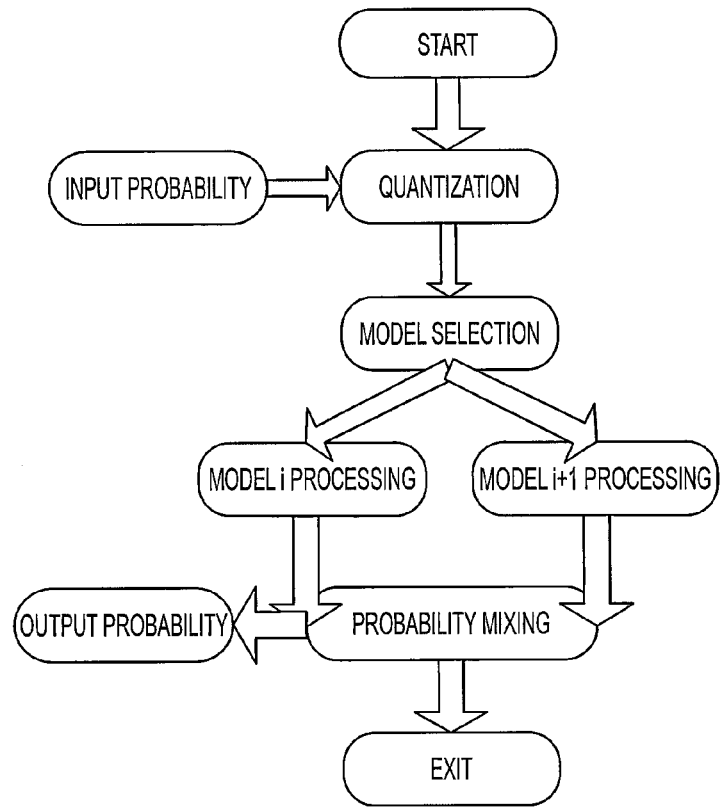
Figure 6B:
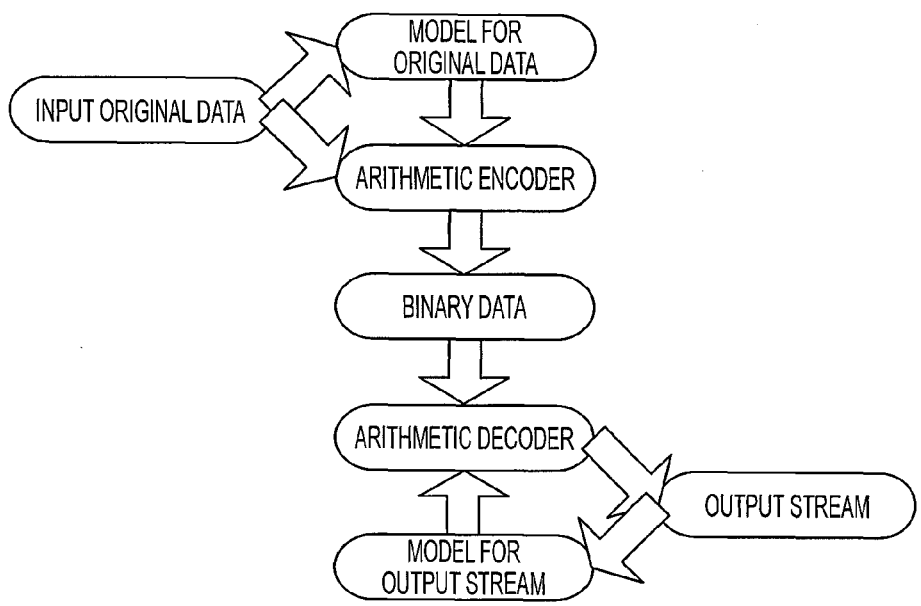
Figure 7A:
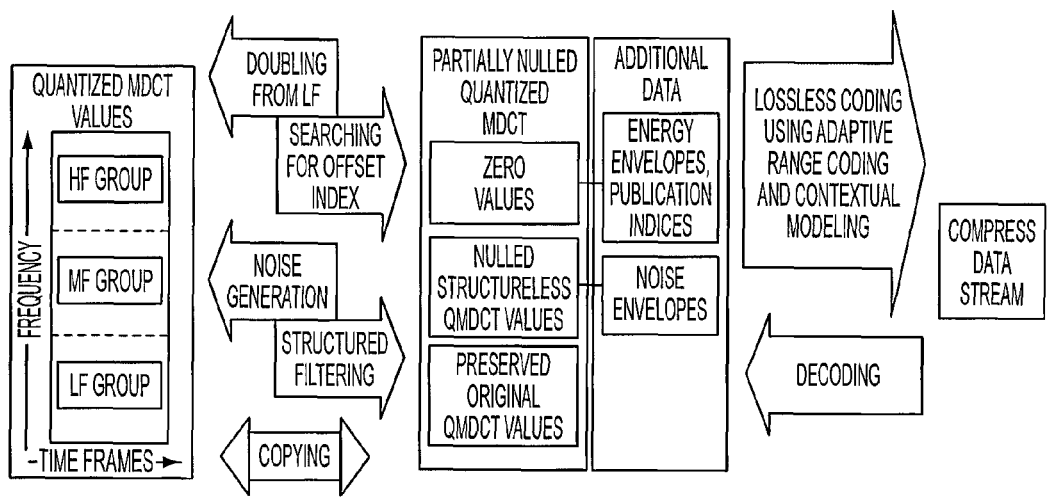
Figure 7B:
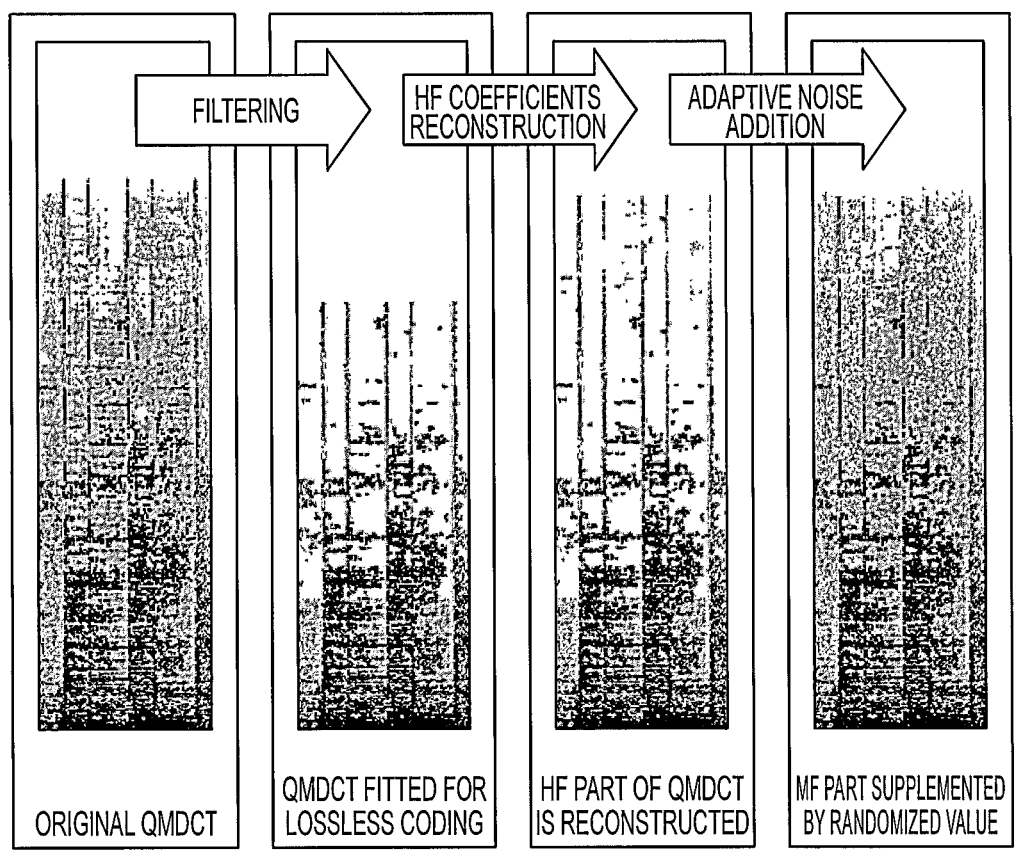
Figure 8A:
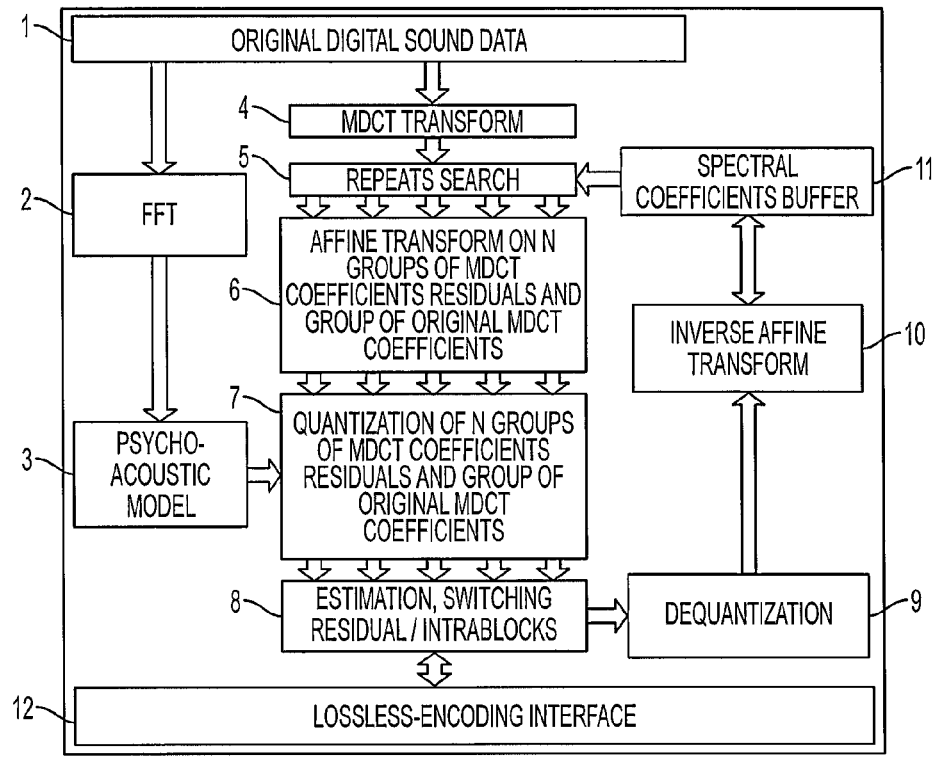
Figure 8B:
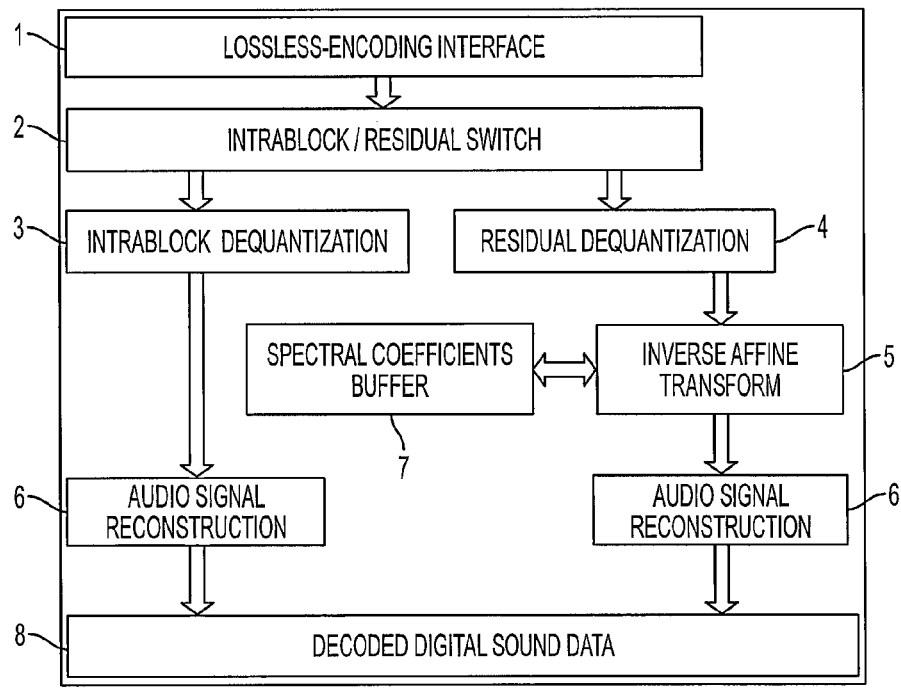
Figure 8C:
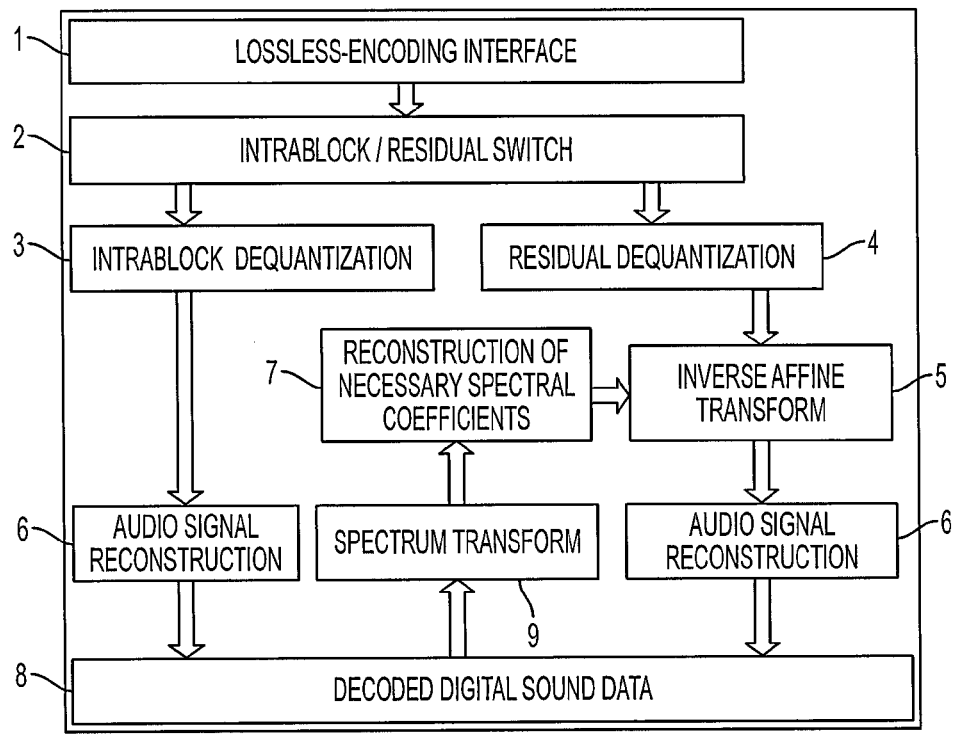
Figure 9:
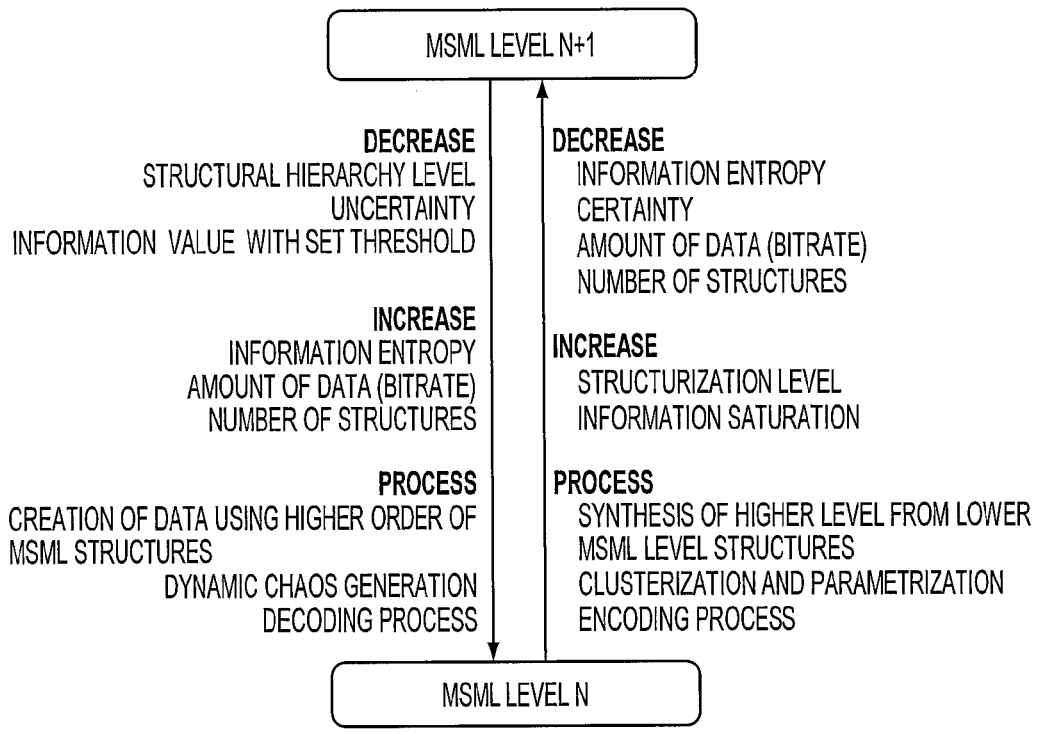
Figure 10:
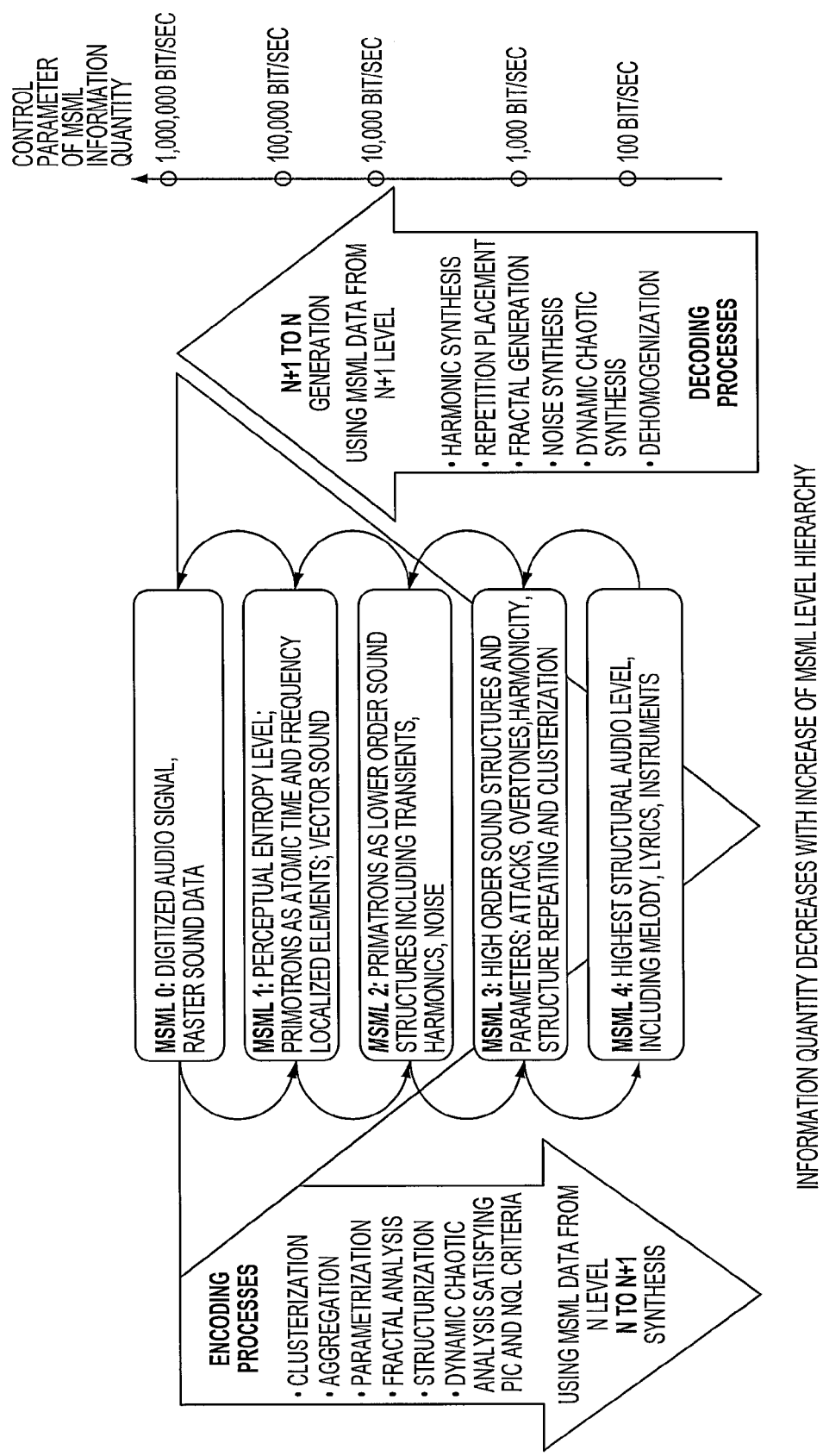
Figure 11:
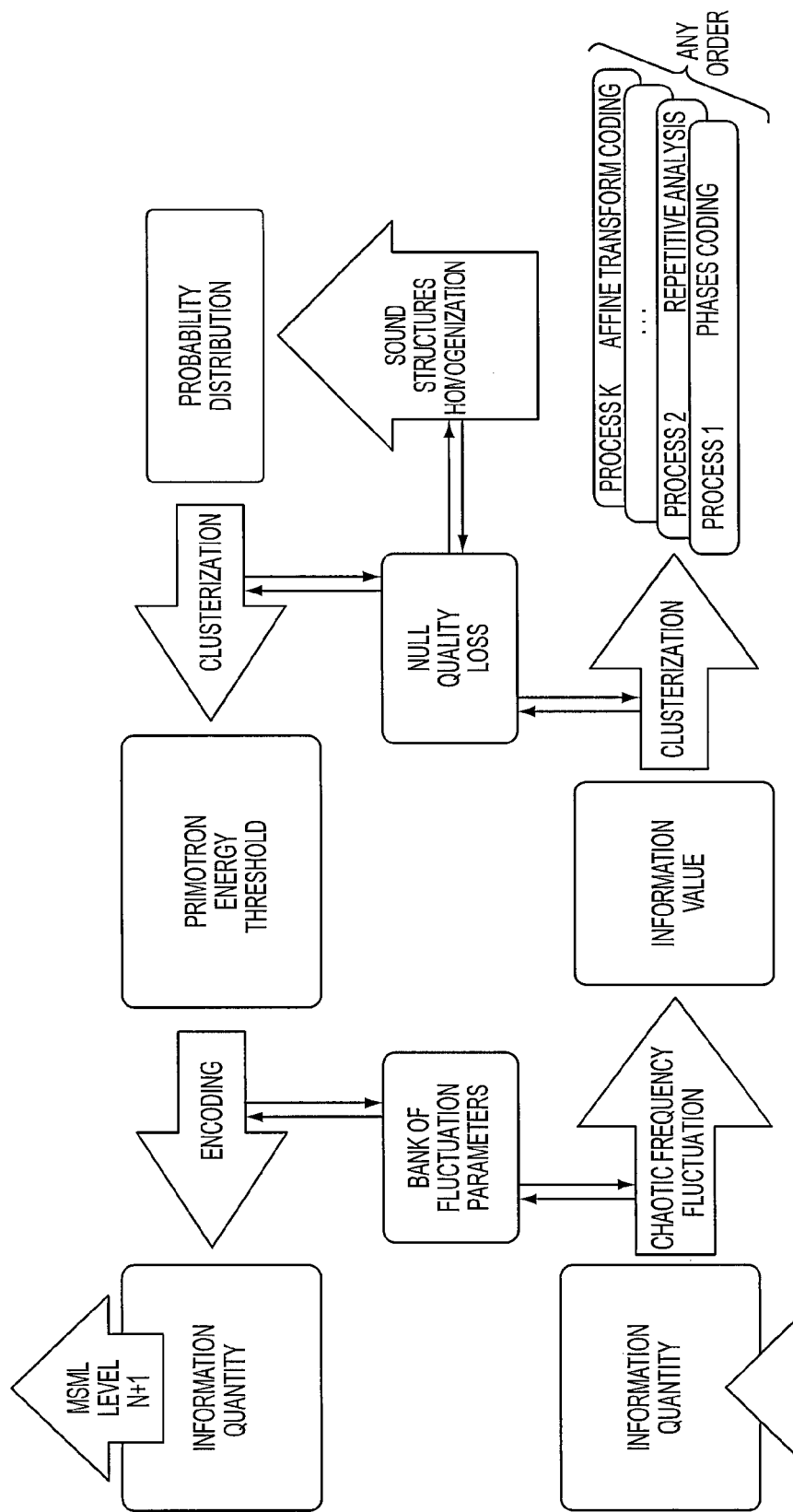

Having thus described the disclosure in general terms, reference will now be made to the accompanying drawings, which are not necessarily drawn to scale, and wherein:

FIG. 1 schematically illustrates a multi-structure, multi-level formalization of digital audio data, as one example of structuring information according to various aspects of the present disclosure;

FIGS. 2A-2C schematically illustrate a visualization of informative sound information primotrons corresponding to an MSML formalization of a digital audio file, as one example of structuring information according to various aspects of the present disclosure;

FIG. 3A schematically illustrates a manipulation process for phaseless encoding of digital audio data, as one example of structuring information according to various aspects of the present disclosure;

FIG. 3B schematically illustrates a manipulation process for phaseless decoding of digital audio data, as one example of structuring information according to various aspects of the present disclosure;

FIG. 4A schematically illustrates a manipulation process for decomposing a musical composition into a residual part and a repeating part (i.e., extracting fuzzy repetitive elements), based on 3 equal "base" signals, as one example of structuring information according to various aspects of the present disclosure;

FIG. 4B schematically illustrates a manipulation process for decomposing a musical composition to extract fuzzy repetitive elements, as one example of structuring information according to various aspects of the present disclosure;

FIG. 5 schematically illustrates a manipulation process for audio compression using hierarchy repetitive structures, as one example of structuring information according to various aspects of the present disclosure;

FIG. 6A schematically illustrates a manipulation process for lossless compression using a contextual model involving a probability mixing method, as one example of structuring information according to various aspects of the present disclosure;

FIG. 6B schematically illustrates a manipulation process for lossless compression using a secondary probability estimation method, as one example of structuring information according to various aspects of the present disclosure;

FIG. 7A schematically illustrates a manipulation process for efficient audio data streaming using a lossy compression scheme involving an audio data accelerator and a Null Quality Loss (NQL) process to reduce the number of quantized time-frequency spectral coefficients (QMDCT), as one example of structuring information according to various aspects of the present disclosure;

FIG. 7B schematically illustrates QMDCT coefficient fragments resulting from a manipulation process involving a lossy compression scheme, as one example of structuring information according to various aspects of the present disclosure;

FIG. 8A schematically illustrates an encoding scheme of an affine transforms coding manipulation process, as one example of structuring information according to various aspects of the present disclosure;

FIG. 8B schematically illustrates an decoding scheme of an affine transforms coding manipulation process, as one example of structuring information according to various aspects of the present disclosure;

FIG. 8C schematically illustrates a fast decoding scheme of an affine transforms coding manipulation process, as one example of structuring information according to various aspects of the present disclosure;

FIG. 9 schematically illustrates changes in data between levels of an MSML formalization of a digital information file and particular encoding and decoding processes associated therewith, as one example of structuring information according to various aspects of the present disclosure;

FIG. 10 schematically illustrates changes in data between levels of an MSML formalization of a digital audio file and particular encoding and decoding processes associated therewith, as one example of structuring information according to various aspects of the present disclosure; and FIG. 11 schematically illustrates processes applied to data between levels of an MSML formalization of a digital information file, as one example of structuring information according to various aspects of the present disclosure.

DETAILED DESCRIPTION OF THE DISCLOSURE

The present disclosure now will be described more fully hereinafter with reference to the accompanying drawings, in which some, but not all aspects of the disclosure are shown. Indeed, the disclosure may be embodied in many different forms and should not be construed as limited to the aspects set forth herein; rather, these aspects are provided so that this disclosure will satisfy applicable legal requirements. Like numbers refer to like elements throughout.

Several contemporary main theories of certain phenomena are based on relatively simple principles of optimality formulated in a single phrase. Yet, to come to such simple formulations generally required a significant and time-consuming evolution with respect to the underlying theory. For example, geometrical optics is based on the principle of a minimum of movement along the light beam, mechanics exploits the principle of a minimum of action, thermodynamics is based on the principle of a maximum of entropy, evolution theory is based on the principle of survival of the most adapted species, and biology implements the principle of a minimum of energy. Aspects of the present disclosure, namely aspects directed to a sound formalization theory (based on multiple structure/multiple level (MSML) arrangement), as disclosed, are generally based on and directed to the principle of maximization of informativeness with respect to data file size wherein, in particular aspects, such a principle extends to maximization of informativeness or information value of data elements in conjunction with minimization of data file size.

As an initial premise, it may be the case that the amount of information included within sound waves delivered to human ears is appreciably greater than that which is received by or is otherwise perceived by the human brain. As such, succinctly determining and quantifying the extent of information that is received and can be perceived by the human brain may help to facilitate a sound formalization schema that more closely corresponds to the human perception mechanism for sound/audio, which may be among the most efficient within a living system. Accordingly, aspects of the MSML formalization schema presented herein may address the above-noted issues and may serve to create a universal formalization basis for representing sound, both with respect to speech and music (i.e., audio).

When presented with a full spectrum audio event, it may be the case that at least a portion of audio information is rejected at the physiological level of the human ear structure. That is, the physiology of the human ear may have limitations which do not facilitate reception of all of the audio information (i.e., frequency limitations). Of the portion of the audio information that is received by the human ear physiology, however, the human neuron network associated with the human ear is then responsible for extracting and naturally selecting the most significant sound objects from the remaining audio information. In those instances, the extracted and selected sound objects may be characterized by specific data local to the audio event, as well as, and possibly even primarily, by more global and generalized sound structures.

In this regard, aspects of the present disclosure are directed to such global/generalized sound structures that may be generally associated with human perception of sound/audio. In some instances, such sound structures may be further premised on or otherwise associated with, for example, three levels of Null Quality Loss (NQL), wherein those levels may be dependent on, for instance, a time of perceptive indistinguishability of the received information. More particularly, the three levels of NQL may be characterized as follows:

1. Perceptionally Indistinguishable Sound Events if One Sound Event is, for Example, Distanced by about 20 Msec in Time Duration from Another Sound Event.

For such sound events, NQL can be satisfied only if both sound events have equivalent waveforms. Sound representation models that meet this criterion are generally used in standard or conventional audio codecs. However, an MSML formalization premised on this time scale/duration may include a substantial number or proportion of low informativeness MSML structures or elements. As such, a codec associated with an MSML formalization premised solely on such a criterion may not be capable of maximizing or even preserving necessary informativeness or quality of the MSML structures or elements, particularly, for instance, at low bit rates (or low information quantity).

2. Perceptionally Indistinguishable Sound Events if One Sound Event is, for Example, Distanced by about 1 Min in Time Duration from Another Sound Event.

In this time scale/duration, the requirement for mathematical equivalence (i.e., equivalent waveforms) is not necessary, and perceptional characteristics of the sound events are defined by comparatively much less essential MSML structures or elements, since a relatively lesser quantity of information about the previously heard/experienced initial sound event remains within or associated with the brain. However, more complex sound analysis may be performed to determine whether structures or elements associated with the second level or higher levels of MSML formalization may have sufficient quality, though exact correspondence may not be necessary to achieve perceptional equivalence.

3. Perceptively Equivalent Sound Events if One Sound Event is, for Example, Distanced by about 1 Day or More in Time Duration from Another Sound Event.

In this time frame/duration, the human brain generally retains only highly concentrated sound information structures, which generally represent/correspond to higher levels of the MSML formalization schema. Such structures play a significant role in aspects of sound analysis presented herein and are important for perceptive equivalence, though the quantity of information/informativeness of the structures/elements is relatively less than at the previous time frame/duration. Generally, trained audio professionals may be able to distinguish lower level sound structure (i.e., associated with the previous shorter time frames/durations, even at long time lapses between sound events, though transition/progression from lower to higher level sound structures (i.e., from the shorter time frame/duration to the longer time frame/duration) is generally the common process for a majority of persons experiencing the sound events.

According to physical theory, in a system having a number of allowable states under certain conditions, the more ordered the system, the less entropy is present. Also, from the second law of thermodynamics, entropy generally increases in isolated systems. However, according to Schroedinger, a person continually strives to reduce entropy in life experiences in order to support internal organization, or otherwise to save structured information. The concept of entropy may also sometimes be equated with the amount of information, as well as the information itself, at least partly due to the lack of a scientific determination of information and numerous definitions of information. According to Shannon, the amount of information is inversely proportional to the entropy. That is, the less probable the event (more entropy), the less information is included in the data about that event. Otherwise, the amount of information can be represented as a quantitative change in uncertainty as a result of communication. However, the amount of information is only one attribute of such information (which may have many of other attributes), and the information value may be the most important of those other attributes. In any instance, from many definitions of information, aspects of the present disclosure may be premised on one given by Casteler: "information is a memorized choice from a number of possible choices."

According to Chernaysky, macroinformation is a memorized choice, namely the time duration of existence of knowledge which is greater than the time duration of using the given information associated with that knowledge. Microinformation is a non-memorized choice of one aspect out of a number of possible aspects. The scope of physical entropy (or Boltzman's entropy) is limited to ergodic systems which quickly forget their previous state (thus, in gas this time is approximately $10^{-13}$ sec at temperature of ~300K). In this regard, the amount of macroinformation is proportional to the logarithm of an amount of steady states, and microinformation is proportional to the logarithm of an amount of all states, not necessarily steady states. For example, the amount of microinformation in a vessel filled with gas is:

$I_{micro}=\log_2$(the number of all states)$=\log_2(\exp(S/k))$, where S is the entropy equal to 3/2kN ( i.e., the information is 2.16*N, which is comparable to Avogadro's constant on the order of $10^{23}$)

$I_{macro}=\log_2$(the number of steady states)$=\log_2(1)=0$(since there is only one steady state, that is thermodynamic balance).

Thus, the concept of information content depends on whether that information can or cannot be used. More particularly, white noise in a sound can be considered the equivalent of thermodynamic balance, since both states correspond to that of maximum entropy of the respective system. A corollary can be drawn to a vessel filled with gas, namely where the macroinformation is minimal and equals zero, while the microinformation is maximal.

According to one aspect, information value can be defined as the difference between the entropy of system with and without the effect of received information. Mathematically, such information value can be defined as: $V=\log_2(P_1/P_0)$, where $P_0$ is the probability of meeting the purpose without reception of information, and $P_1$ is the probability of meeting the purpose with the received information, though the notion of purpose may be different for each system. In this regard, the purpose of each element is to store (preserve) the information associated therewith. Once the purpose is stated or otherwise defined, the evolution of the value of obtained information associated with that purpose may be tracked and analyzed. Accordingly, aspects of the present disclosure include a purpose of analyzing and extracting primotrons from digitized audio as the basis for sound synthesis schema. One skilled in the art will appreciate, however, that reference herein to sound or audio is merely an exemplary illustration of the applicability and capabilities of the systems and methods disclosed herein, and that the systems and methods disclosed herein may be more generally applicable to any information capable of being analyzed in digital form such as, for example, digital media including audio, video, and the like.

Aspects of the disclosure may thus provide, for example, systems and methods for analysis, identification, and structuring of primotrons (i.e., primary representative data elements or structures) arranged among different levels of the MSML hierarchy, and associated with the digital audio or other digital media file convertible to an MSML format. Further, such systems and methods of analysis, identification, and structuring can be different from synthesis or reconstruction of the audio or other digital media within a threshold of the original digital media, from such primotrons. That is, coding of the original digital media file can be a different process from decoding the coded file to synthesize or form a reconstruction of the original digital media file. In any instance, the general approach of particular aspects of the present disclosure directed to the primotron-based description or representation of sound or other media may allow the representation (i.e., the determination of the data element combinations forming the primotrons) and synthesis ("reconstruction") of the primotrons to form a sound or other media file may be based on interactions of interfaces (otherwise referred to herein as "manipulation processes") with the MSML formalization, wherein such manipulation processes may be independently functional or cooperative for a particular function or in particular instances. Since the nature of sound (especially music and speech), but also to an extent other media such as video, may be based upon particular repetitiveness of basic sound or other basic elements (i.e., individual letters, word spelling, melody symbols, harmonics), then particular primotrons or combinations thereof may be used as a compact representation of the MSML-processed file in terms of arranging these identified basic or primary elements in a highly structured manner (wherein the structured data may have associated therewith particular chaotic parameters which may facilitate interpretation of the data as well as the structure thereof) that reduces the information quantity, for example, by reducing or minimizing redundancy of these elements, while ensuring the these structured basic elements retain within a perceptive threshold as much or more of the information value than the original file. Moreover, in such a manner different levels of primotrons or data elements in the MSML hierarchy may serve as the seed(s) from which the general signal (i.e., the original digitized audio file) can be synthesized or otherwise restored, if the corresponding instructions or rules for such synthesis are defined, for example, by way of the chaotic parameters or in another suitable manner (i.e., involving a statistical evaluation of reconstruction probabilities).

As such, in review, aspects of the present disclosure provide methods of audio or other digital media processing directed to forming a compact Multi-Structural, Multi-Level (MSML) digital formalization of such sound or other media (see, e.g., FIGS. 1, 9, 10, and 11), wherein such methods are premised on particular definitions of an information primotron, Perceptive Information Criteria (PIC) associated with the existence of such primotrons (i.e., associated with the limits of human perception), and determination of combinations or sets of data elements forming such primotrons. Such MSML formalization may also involve methods of extraction and classification of primotrons from digital audio or other digital media files in both time and time-frequency domains. Also associated with MSML formalization procedures as disclosed herein may be the definition of a secondary level or set of MSML sound structures and the PIC associated therewith, which may also involve at least some primotron analysis for constructing such secondary MSML structures. The MSML formalization procedures may also be associated with the definition of a high level or set of MSML sound structures and the PIC associated therewith in the hierarchy, which may also involve analysis of lower level MSML structures for selecting or otherwise defining particular higher level MSML structures. These principles and methods cooperate to allow construction of a parametric structural model of sound or other media for the purpose of formalization, notably the MSML formalization disclosed herein, which may promote and facilitate organization of the data in to particular structures and sets of structures. Also associated with the MSML formalization procedures may be methods and apparatuses for establishment of a time-frequency domain primotron library that may be used for sound synthesis or reconstruction, where particular primotron disposition(s) within the library may be defined by the higher levels structures of the MSML formalization.

Aspects of the present disclosure also provide methods of determining such Perceptive Information Criteria (PIC) for defining probabilities of primotron existence by performing a comparison of two energy values, wherein one energy value may be determined for a structure which forms or is otherwise associated with a primotron, and wherein the second energy value may be calculated for a fraction of a digital signal, within the time-frequency domain, which includes the noted primotron. If the ratio of the first energy value to the second energy value is larger than a predetermined threshold value, then the PIC for the noted primotron, affirming the existence thereof, is satisfied.

Another aspect of the present disclosure is directed to a method of defining a threshold energy value as an acceptable probability of an event where random chaos fluctuation can be recognized as a valuable sound structure, wherein such a probability may be determined by performing a computational experiment or by direct application of a theoretically-derived formula to define a probability distribution function using random noise as an input signal.

Yet another aspect of the present disclosure is directed to a theoretical formulation of a primotron energy threshold value definition through a process which includes the calculation of the surface area of n-dimensional sphere ($S_n$) of a single unit radius in a time-frequency domain, using the following implicit function:

$$P(N, M, k) = \frac{S_{M-1} S_{N-M-1}}{S_{N-1}}$$

$$\sum_{l=0}^{N-M-1} \sum_{q=0}^{M-1} \left[ \frac{C_{N-M-1}^l C_{M-1}^q}{2^{N-2} iM \binom{2l+2q-}{N+2}} (-1)^{M-1-q} \left( e^{i(2l+2q-N+2)arcsin(\sqrt{k})} - 1 \right) \right]$$

where K is the targeted energy threshold of the first M components of an N dimensional vector divided by total vector energy. Indices in the sum terms include values $2l+2q-N+2=0$ and $$\frac{e^{i(2l+2q-N+2)arcsin(\sqrt{k})} - 1}{i(2l+2q-N+2)} \otimes arcsin(\sqrt{k})$$

so that:
$S_n$ is determined as:

$$S_{2l} = \frac{(4\pi)^l (l-1)!}{(2l-1)!},$$

-continued $$S_{2l+1} = \frac{2\pi^{l+1}}{l!}.$$

Still another aspect of the present disclosure is directed to a method of defining a Null Quality Loss (NQL) criterion by comparative analysis between an original signal and signal synthesized or otherwise restored in accordance with the MSML formalization procedures disclosed herein.

Yet another aspect of the present disclosure is directed to a method of defining a PIC as a probability factor for constructing a new higher-level structure of the MSML formalization hierarchy, only when the establishment or origination of such a higher level structure decreases the overall entropy of the lower level structures of the MSML formalization that cooperate to form the higher level structure.

A further aspect of the present disclosure is directed to a method for determining or designating a primotron structure as a number of corresponding primotrons or other data elements within the first level of the MSML hierarchy according to the time coordinate associated therewith within the time domain. Further, such an aspect may also include defining a hit as time-localized second level primotrons, primotron structures, or other data elements having the same time onset coordinates, wherein a decrease in entropy in a higher level structure (i.e., a more concise description) is provided by eliminating redundancy of primotron time component values apparent in the lower level structure. Such an aspect may also include defining harmonics as frequency-localized second level MSML structures, wherein a subsequent primotron onset or encounter coincides with the previous primotron end coordinate. In such instances, the decrease in entropy for a higher level structure is also provided by eliminating redundancy of primotron time components values. Such an aspect may still further include defining an overtone set as frequency-localized second level MSML structures which include a single base frequency from the first level MSML structures and a number of copies thereof shifted by fixed frequency value from the base frequency and each other. The overall entropy of such structures may tend to decrease as a result of a compact description of the set of first level structures by single parameter associated with the frequency shift.

More particularly, where the original digital information file is a digital audio file, such an aspect of the present disclosure involves associating an information quantity of the digital audio file with a bit rate proportional to a size and a time duration of the digital audio file, and associating an information value of the digital audio file with a quality of the digital audio file, wherein the quality is determined from at least one of a primotron energy threshold value, a Perceptive Information Criteria (PIC), a sound structure identified from a random chaos fluctuation event determined according to a probability distribution function using random noise as an input signal, a Null Quality Loss criteria, and a surface area of an n-dimensional sphere of a single unit radius in a time frequency domain determined from an implicit function.

In particular aspects, for example, in the case of a digital audio file as shown, for example, in FIGS. 2A-2C, structuring interfaces or manipulation processes may be successively applied to a previously resulting digital audio file to form a last resulting structured digital audio file configured according to an information hierarchy having a plurality of information levels, wherein a lower information level in the hierarchy comprises a representation of the audio as a high resolution digital information file, and a higher information level in the hierarchy comprises, for example, a sheet representation including a written note score with correspondent lyrics. When so structured, the higher information level may have a smaller information quantity than the lower information level in the hierarchy, wherein the lower information level is being capable of being formed, synthesized, or reconstructed from the higher information level and chaotic parameters associated with performance and digitization of the audio according to the sheet representation.

Another aspect of the present disclosure recognizes that successively applying manipulation processes to the previously resulting digital audio file forms the last resulting structured digital audio file, wherein the last resulting structured digital audio file comprises at least one primotron defined in one of a time domain and a time-frequency domain, and thereby represents a compact digital formalization of a harmonic signal, wherein the information quantity associated with the audio bit rate is reduced compared to the digital audio file corresponding to the original digital information file, while the information value associated with the audio quality is maintained within a threshold of the digital audio file corresponding to the original digital information file.

Yet another aspect of the present disclosure recognizes that each digital audio file represents harmonic-related data, and analysis thereof involves defining hits as time-domain higher level hierarchical structures; defining harmonics as frequency-domain higher level hierarchical structures having a subsequent harmonic primotron origination coinciding with a previous harmonic primotron termination; eliminating redundancy in time-domain lower level hierarchical structures to obtain a decrease in entropy in the higher level hierarchical structures; and defining overtones as frequency-domain higher level hierarchical structures having a single base frequency corresponding to the lower level hierarchical structures and a plurality of copies the higher level hierarchical structures shifted by a fixed frequency from the single base frequency and each other.

In a more general sense, MSML formalization may refer to a method of structuring information, wherein such information may comprise, for example, digital information such as audio data, as referenced above and otherwise herein. In doing so, an original digital information file is first analyzed to determine an original information quantity and an original information value associated therewith. That is, it is first determined how many data elements are included in the digital information file, and the associated level of informativeness associated with each such data element. In structuring the information, an initial manipulation process may be applied to the original digital information file to form a first resulting digital information file, and a subsequent manipulation process applied to the first resulting digital information file to form a second resulting digital information file. In such instances, each manipulation process may be configured to remove at least one element of the processed digital information file, wherein such a removed element may be, for example, identified as being redundant, noise, or otherwise unnecessary. In other instances, each manipulation process may be configured to represent a combination of a plurality of elements of the processed digital information file with a representative element and a first indicia associated with an interrelationship between the representative element and at least one of the plurality of elements in the combination, so as to reduce the information quantity of and to structure the processed digital information file. That is, elements may be combined and represented by a single representative element, wherein the single representative element may have associated therewith a first indicia indicating, for example, a reason, an analysis result, or any other suitable indicator as to why the particular elements were combined and to the nature of the relation between that particular combination of elements and the designated representative element (i.e., the representative element represents that the combined elements form a repeated pattern or melody, define a harmonic, are associated with lyrics, etc.). In removing one ore more element and/or combining elements, each manipulation process may be configured such that the at least one of the removed element and/or the representative element is determined to reduce the information value of the processed digital information file by no more than a selected threshold. That is, while the previous information quantity may be reduced, each manipulation process is preferably configured such that the information value of the resulting digital information file is within a particular quantity or other suitable measure of the original or preceding digital information file (i.e., within a particular threshold). In this manner, manipulation processes may be successively applied to the previously resulting digital information file (i.e., for each resulting digital information file, another manipulation process may be applied thereto), until successive manipulation process applications do not achieve a threshold reduction in the information quantity in the subsequent resulting digital information file over the previously resulting digital information file. That is, the process of applying a manipulation process to each resulting digital information file may continue until there is no further appreciable (i.e., within a threshold) decrease in the information quantity in a subsequent resulting digital information file over the previous resulting digital information file. In other words, the application of the last-applied manipulation process does not result in an appreciable removal of element(s) and/or an appreciable combination of elements that are represented by a representative element. As such, the last resulting digital information file may thereby having a primary structure with a reduced information quantity with respect to the original information quantity and a resulting information value within the selected threshold of the original information value. That is, the quantity of information included in the last resulting digital information file is less than the information quantity in the original digital information file, but the information value or informativeness of the data in the last resulting digital information file is within a certain acceptable measure (i.e., within a threshold) of the original digital information file (see, .e.g., FIGS. 9-11).

Over the process of successively applying various manipulation processes to the each resulting digital information file, at least the last resulting structured digital information file may be configured according to an information hierarchy having a plurality of information levels. That is, the last resulting digital information file includes relatively highly structured information (as compared, for example, to the original digital information file), wherein the amount of data or information within the file is less than the original digital information file, but the value of that data or information is within a particular quantity or threshold of the original digital information file (i.e., a smaller file in terms of data quantity, but wherein the file has approximately the same or possibly more information value). Moreover, in being so structured, the last resulting digital information file may have a hierarchical configuration, wherein the data in the higher information levels of the hierarchy may be related to the data in the lower levels of the hierarchy by way of various chaotic parameters. That is, a higher information level of the information hierarchy may include a smaller information quantity than a lower information level, wherein the higher information level is formed from a structure (i.e., data combinations or combinations of particular elements) of the lower information level and chaotic parameters (i.e., reasons or other parameters leading to the particular combination) associated therewith. In some instances, the higher information level may be formed such that the higher information level includes a higher information value than the original information value, for example, due to the information associated with the chaotic parameters. In some instances, if necessary, a plurality of lower information levels may be formed from a structure of a higher information level, and at least one of the plurality of lower information levels may be selected for association with that higher information level. In such instances, the relationship therebetween may be defined by particular chaotic parameters.

In some aspects, a plurality of manipulation processes may be simultaneously applied to a previous digital information file so as to form a secondary structured digital information file, in addition to the primary structured digital information file. In such aspects, the primary and secondary structured digital information files may be analyzed so as to determine at least one of an interrelationship between information levels within one of the primary and secondary structured digital information files, and an interrelationship between the primary and secondary structured digital information files. Such interrelationships may, in some instances, may include or otherwise be associated with the chaotic parameters previously disclosed.

In some aspects, at least one of a plurality of manipulation processes may be applied to a previous digital information file, wherein the manipulation processes may be selected from the group consisting of, for example, a phaseless coding manipulation process, a structured analysis manipulation process for repetitive structures, a phaseless repetition coding manipulation process, a lossless entropy compression manipulation method, a loss-less accelerator manipulation process for forming an additional compression layer for a previously reduced audio data file, an accelerator manipulation process for facilitating efficient audio data streaming, and an affine transforms coding manipulation process.

More particularly, in one aspect of a manipulation process, bandwidth and bit rate reduction of audio data may be realized using a phaseless coding interface for an MSML sound composition formalization, wherein the interface is configured to consider a perceptive information value hierarchy (see, e.g., FIG. 3A). The bandwidth and bit rate reduction can be achieved by using such an interface to perform tasks targeting selected data reduction, while retaining informativeness of all sound structures associated with the sound composition, for example, through the use of sound metrics. In doing so, a comparison of different level sound objects in space is performed, focusing on determining the integrity of the structures and the degree of damage thereto, within a reduced representation of the signal after filtration, which facilitates selection of a proper parameter for each sound element. The phaseless coding interface is appropriately configured such that signal time dependence is not preserved, and sound structures are conserved instead of signal waveform, thus resulting in a decrease in essential bandwidth and bit rate. To achieve a higher rate of audio bandwidth and bit rate reduction, the relatively more informative level structures of the MSML sound composition formalization are configured to maintain constant parameters. The parameters of the relatively less informative level structures within the hierarchy may be saved with less accuracy or are generated during decoding with the use of random values, wherein an exemplary decoding process associated with such a phaseless coding interface is shown, for example, in FIG. 3B.

According to another aspect of a manipulation process, an audio data structure analysis may be performed, using a structure analysis interface for an MSML sound composition formalization, for extraction of fuzzy repetitive elements from such music compositions as shown, for example, in FIGS. 4A and 4B. Such a structure analysis interface may be configured to process audio data received from the original signal MSML formalization and to identify fuzzy repetitive loop elements within a relatively low level of the MSML formalization, for use in further data reduction and without lowering the overall signal informativeness. Such an interface may comprise three modules, wherein the first module may provide search, positioning, and length marking of all fuzzy repetitive elements throughout the entire initial level of the MSML formalization. The second module may be configured to extract a general sound constituent for any set of fuzzy repetitive fragments and to define the level of data cohesiveness by forming a correspondent residual signal. The third module may be configured to perform a predictive construction of the resultant audio fragment by integrating extracted repetitive elements, corresponding marking data, and residual information. A filtering method for phase modeling may be applied to minimize required initial phase information during the sound construction process. Such an interface may be configured to be used as an element for a variety of applications, including but not limited to, for example, music search engines, music visualization, and deep audio compression technologies.

Another aspect of a manipulation process involves audio compression using hierarchy repetitive structures in an MSML sound composition formalization as shown, for example, in FIG. 5. Such an advanced phaseless repetition coding interface utilizes structures formed by macro-repetition sound primotrons of the highest level within a meaningful MSML formalization sound hierarchy. Two types of data may be used for the decoding process: large scale data that defines the general structure within the MSML formalization and data that comprises original signal fragments described by a relatively lower level in the hierarchy. To compress the signal fragments, a general psycho-acoustic coder can be utilized, in some instances, possibly using an outer signal masking. Bit rate reduction occurs due to the elimination of repetitive fragments constructed at the highest level of MSML formalization, while storing the locations of these fragments. Perceptive equivalence of repetitive fragments allows a reduction in the number of reference samples.

Yet another aspect of a manipulation process involves audio bandwidth and bit rate reduction using a lossless compression interface for an MSML sound composition formalization (see, e.g., FIG. 6A) which, in some instances, reduces the number of integer value arrays associated with the MSML sound composition formalization through the use of an advanced entropy coder performing only integer operations, without divisions and secondary probability estimations. Since the interface's range coder and contextual model don't use the mathematical operation of division, it allows the application of such an interface to/execution of the interface by the majority of low cost microcomputers that do not have a division operation. To improve the contextual model reliability of the interface, secondary probability estimation (see, e.g., FIG. 6B) may be employed. Secondary probability estimation is a complex contextual model that utilizes predicted probability as a context to another model. 2-dimensional secondary probability estimation can also be used for mixing two different models. 2-dimensional secondary probability estimation is a modification of secondary probability estimation, which has two input probabilities and uses them as a context. Additional integer contexts can also be used. Such an aspect of a manipulation process may also involve improving compression of audio signals, and/or improving arithmetic coding and contextual modeling to increase compression ratios and processing speeds, and thereby allow spectral data to be compressed with high effectiveness and higher speed. The compression procedure is capable of being fully automated and does not necessarily require pre-initialization for different types of audio or other digital data. It may be sufficiently flexible to adjust for different sizes or quantities of spectral audio or other digital data, permitting it to be used with different spectral transforms. Instead of a standard arithmetic coder, a more efficient range coder may be used. Context modeling is applied to the data stream, constructed algorithmic models, and the algorithmic optimization of a decoder function. This aspect may also be at least partially based upon the use of adaptive range coder techniques involving increasing the probability of the value coded. To improve the contextual model reliability, a secondary probability estimation may be employed.

Other aspects of manipulation processes involve efficient audio data streaming using an audio data advanced accelerator interface for an MSML sound composition formalization, utilizing a Null Quality Loss (NQL) process to reduce the number of quantized time-frequency spectral coefficients (QMDCT), to provide faster delivery of the original audio or other digital information without essential quality degradation in the resultant sound or data (see, e.g., FIGS. 7A and 7B). The NQL process performs a classification of sound structures within the MSML formalization depending on the importance thereof based on human perception. The advanced accelerator interface reconstitutes quantized time-frequency spectral coefficients of the initial format, without data de-quantization or reverse transcoding, via PCM format. Such an advanced accelerator interface divides the initially encoded file of time-frequency spectral coefficients into three groups, where coefficients from a low frequency spectral group remain unchanged, while some coefficients from an intermediate frequency group are zeroed using the NQL process, and coefficients from the third group (highest frequencies) are eliminated by replacing them with the most similar sub-groups of coefficients, stitching them into low and intermediate groups, and saving a reference to this similar sub-group, as well as, for example, an integral factor associated therewith, without affecting structural sound or other digital data elements (i.e., harmonics and hits).

Yet another aspect of a manipulation process involves reducing audio or other digital data file size or quantity, using an affine transforms coding interface for an MSML sound composition formalization (see, e.g., FIG. 8A), while (in the case of audio) preserving full integrity of the original sound reproduction in a form of an affine transform of the similar sound primotrons, which leads to a decrease in signal entropy. The affine interface associated with the MSML formalization may be used as an addition or supplement for any audio or other digital data coding procedure in order to increase the compression ratio, as well as the core compression process, for the class of the signals where time-frequency affine-similar micro-fragments bear an essential part of the sound (or other digital data) information. This affine transforms coding interface, while used in conjunction with the MSML formalization, is configured to utilize similar spectral micro-fragments of the digital signal (audio or other) for increasing the compression ratio of the signal. During processing, the complete spectral range is split into sub-bands. A search for similar spectral fragments in the preceding part of the sound or other digital data signal is performed independently and using a different step in each sub-band. Affine amplitude, time and spectral shift transform is used during the search for similar fragments. Each fragment found is subtracted from the original spectral fragment and the residual is further processed as a difference of spectral components, thus eliminating significant redundancy of spectral data. An associated decoding scheme for such an affine transforms coding interface is shown, for example, in FIG. 8B, with an optional fast decoding scheme for such an affine transforms coding interface being shown, for example, in FIG. 8C.

One skilled in the art will appreciate that the various aspects of manipulation processes disclosed herein are for exemplary purposes only and are not to be considered in any manner as being limiting with respect to the various manipulation processes that may be applied, either at present or in the future, that may be applicable to structuring digital information data so as to reduce the size of the digital data file (i.e., reduce that actual data or information quantity comprising the digital data file), while retaining an information value of the structured digital data file that is within a threshold value of the information value of the original digital data file. One skilled in the art will further appreciate that the information value of the structured digital data file may, in some instances, have a much smaller quantity of data or information as compared to the original digital information file, but may also have an informativeness (i.e., information value) within a threshold value of the original digital information file and, in particular instances, may even have a greater informativeness than the original digital data file. Such structuring of data according to principles herein and according to various aspects of the present disclosure are illustrated and further detailed, for example, in FIGS. 9-11.

In particular aspects, successively applying manipulation processes in order to obtain a resulting information value within the selected threshold of the original information value may further comprises successively applying such manipulation processes, with the selected threshold being, for example, a limit of human perception (i.e., as previously discussed in relation to perceptive information criteria or, in the case of audio data, for example, the spectral limits of human hearing), so as to preserve the fidelity of the primary structured digital information file with respect to the original digital information file.

In the process of successively applying the manipulation processes to form the resulting digital information files, the resulting digital information files are formed such that each resulting digital information file comprises a set of objects and object clusters, wherein each object and object cluster has a respective definition. More particularly, at least one manipulation process may be applied to remove at least one element of the processed digital information file, and/or represent a combination of a plurality of elements of the processed digital information file with a representative element, a first indicia associated with an interrelationship between the representative element and at least one of the plurality of elements in the combination, and a second indicia associated with an interrelationship between at least two of the plurality of elements in the combination. The resulting digital information files are thus formed such that the objects and object clusters therein comprise at least one of the representative elements and such that the definition associated with each object and object cluster comprises the first interrelationship indicia, and optionally the second interrelationship indicia, associated with the at least one of the representative elements. In some instances, the definitions may be included with the corresponding set of objects and object clusters in each resulting digital information file (i.e., stored together in the file). In other instances, however, the definitions associated with the set of objects and object clusters may be maintained (i.e., stored) separately from each corresponding resulting digital information file. Each of the resulting digital information files may thus be formed such that each subsequent resulting digital information file comprises any recognized patterns of objects and object clusters within the previous resulting digital information file.

In another aspect, the manipulation processes may be successively applied until successive manipulation process applications do not achieve a threshold reduction in the information quantity in the subsequent resulting digital information file. In such instances, the last resulting digital information file may have an information primotron structure comprising a set of primary objects, primary object clusters, and any interrelationships associated therewith. Upon or following application of the manipulation processes, each successive resulting digital information file and the last resulting digital information file may be analyzed so as to determine statistical correlations between subsequent objects in a subsequent digital information file and previous combinations of objects in a previous digital information file. In addition, for any statistical correlation at least meeting a correspondence threshold, a correlation indicia of the corresponding subsequent object and previous combination of objects is stored for analysis of a subsequent original digital information file.

In some instances, each successive resulting digital information file may be analyzed so as to determine at least one objective correlation between a combination of previous objects, and at least one interobject relationship between the previous objects in the combination, in a previous digital information file. The at least one objective correlation and the at least one interobject relationship are then associated with a corresponding subsequent object in a subsequent digital information file. The at least one objective correlation and the at least one interobject relationship associated with the corresponding subsequent object, over a plurality of subsequent objects, may thereby collectively form a set of object correlations representative of the interrelationships associated with the set of primary objects and primary object clusters in the information primotron structure.

In other instances, each successive resulting digital information file may be analyzed so as to determine at least one objective correlation between a combination of previous objects in a previous digital information file, and at least one interobject relationship may be assigned or otherwise designated between previous objects in the combination. The at least one objective correlation and the at least one interobject relationship may then be associated with a corresponding subsequent object in a subsequent digital information file. The at least one objective correlation and the at least one interobject relationship associated with the corresponding subsequent object, over a plurality of subsequent objects, may thereby collectively form a set of object correlations representative of the interrelationships associated with the set of primary objects and primary object clusters in the information primotron structure.

In either instance, the set of primary objects and primary object clusters in the information primotron structure may then be interpreted by statistically evaluating various combinations of the object correlations in the set of object correlations and, for any combination of the object correlations at least meeting a statistical threshold, associating the combinations with the primary objects and primary object clusters as a contextual interpretation of the set of primary objects and primary object clusters in the information primotron structure. A representative digital information file associated with the original digital information file may then be synthesized, for example, by applying the contextual interpretation to the set of primary objects and primary object clusters in the information primotron structure.

Further, from the analysis of each successive resulting digital information file, at least one object, selected from the previous objects, the subsequent objects, and the primary objects and primary object clusters, may be associated with one of a plurality of characteristics of the original digital information file. In doing so, an arrangement of the plurality of characteristics may be determined with respect to a time duration of the original digital information file, and a distribution of the at least one object with may be correlated with respect thereto. In such instances, a summary data file may be formed, with the summary data file including a generalized representation of the distribution of the at least one object associated with each of the plurality of characteristics over the time duration of the original digital information file.

In instances where successively application of manipulation processes until successive manipulation process applications does not achieve a threshold reduction in the information quantity in the subsequent resulting digital information file, an amount and an order of the manipulation processes successively applied to the subsequent resulting digital information files to obtain the last resulting digital information file having the information primotron structure may be cataloged, wherein the amount of manipulation processes is associated with corresponding tiers of an information hierarchy.

As such, according to some aspects, a representative digital information file associated with the original digital information file may be synthesized, for example, according to a conditional process comprising the following steps:

1. Applying any applicable correlation indicia to the set of primary objects and primary object clusters in the information primotron structure to determine the corresponding previous combination of objects associated therewith;
2. If no applicable correlation indicia is determined in Step 1, applying the contextual interpretation to the set of primary objects and primary object clusters in the information primotron structure to determine the corresponding previous combination of objects associated therewith; and
3. if the application of the contextual interpretation in Step 2 is below a threshold information value associated with the original information value, applying an initial reverse manipulation process to the set of primary objects and primary object clusters in the information primotron structure, wherein the initial reverse manipulation process is the first manipulation in the reverse order of the manipulation processes, to determine the corresponding previous combination of objects associated therewith.

In some instances, for the previous combination of objects determined from the set of primary objects and primary object clusters in the information primotron structure, the conditional process including any applicable correlation indicia, the corresponding contextual interpretation, or the next reverse manipulation process in the reverse order of the manipulation processes corresponding to the previous combination of objects, may be applied thereto in order to determine a next previous combination of objects in correspondence therewith. It may thus follow that the conditional process may be successively applied to the next previous combination of objects until the resulting previous combination of objects is associated with the initial tier of the information hierarchy, and the resulting previous digital information file thereby corresponds to the synthesized representative digital information file.

As previously disclosed, MSML formalization may refer to a method of structuring information, wherein such information may comprise, for example, digital information such as audio data. Accordingly, yet another aspect of the present disclosure may involve a method of evolving primotrons at different levels of the MSML formalization (i.e., hierarchical structure) for sound or audio analysis, wherein the evolution of such primotrons may be accomplished through application of independent interfaces to the general MSML formalization, wherein such interfaces may comprise, for example, manipulation processes for analyzing and modifying the data structure of the MSML formalization to facilitate such primotron evolution. Such an aspect may also include a method of sound synthesis which utilizes the set or combination of primotrons defined and determined in association with MSML formalization, and particular instructions and rules defining the complex signal afforded by the MSML formalization, through application of the interfaces thereto, successively and/or concurrently, as well as any evolution of such primotrons associated therewith, to synthesize or reconstruct a sound or audio signal or file substantially corresponding to the original digitized audio file.

In one example of such interfaces (i.e., representing a manipulation process capable of being applied to a digital audio or other information file) applied to the general MSML formalization, bandwidth and bit rate reduction of the audio data may be realized using a phaseless coding interface for the MSML formalization of the sound composition (see, e.g., FIG. 3A). Such a phaseless coding interface may be configured, for instance, to consider a perceptive information value hierarchy to determine which data within the file can be retained, transformed, or discarded. More particularly, once the digital audio signal has been analyzed and the corresponding MSML formalization has been determined, lossless compression may be applied, for example, by a range coder to process 1) harmonic structures in the form of a 2D raster; 2) total energy envelope with high time resolution and several frequency bands; and 3) noise energy-to-total energy ratio. The phaseless coding method may be applied to the MSML formalization to perform, for example, tasks targeting selected reduction of the data in the MSML formalization, while retaining sound structures of high informativeness (i.e., a high information value) associated with the sound composition, for example, through comparison to known sound metrics. Generally, such a method performs a comparison of sound objects of different levels in space, in order to determine the integrity of the structures and the degree of degradation thereof that may result within a reduced (i.e., lower information quantity or bit rate) representation of the audio signal after filtration and/or processing, which facilitates selection of a proper parameter for each sound element for achieving information quantity/bit rate reduction while retaining informativeness. In some instances, the phaseless coding interface is appropriately configured such that signal time dependence is not necessarily preserved, and sound structures are conserved instead of signal waveform, thus resulting in a decrease in essential bandwidth and bit rate. To achieve a higher rate of audio bandwidth and bit rate reduction, the relatively more informative level structures of the MSML sound composition formalization may be configured to maintain constant parameters. The parameters of the relatively less informative level structures may thus be retained with less accuracy or may be generated during decoding, for example, with the use of random values or appropriate parameters.

In another example of such interfaces/manipulation processes capable of being applied to the general MSML formalization, an audio data structure analysis interface for an MSML sound composition formalization may be configured to extract fuzzy repetitive elements from such music compositions (see, e.g., FIGS. 4A and 4B). Such a structure analysis interface may be configured to process audio data associated with the MSML formalization audio data file in order to identify fuzzy repetitive loop elements within a relatively low level of the hierarchy of the MSML formalization. In such instances, like-identified fuzzy repetitive loop elements can be replaced by a representative element and associated chaotic parameters to thereby provide information/data quantity or bit rate reduction, without appreciably decreasing the overall information value or informativeness. Such an interface may comprise, for example, three modules. The first module may be configured to provide search, positioning, and length marking of all fuzzy repetitive elements throughout the entire initial level of the MSML formalization. The second module may be configured to extract a general sound constituent for any set of fuzzy repetitive fragments and to define the level of data cohesiveness by forming a correspondent residual signal. The third module may be configured to perform a predictive construction of the resultant audio fragment by integrating extracted repetitive elements, corresponding marking data, and residual information from the residual signal. A filtering method for phase modeling may be used to minimize required initial phase information during the sound construction process for the resultant audio fragment. This interface may further be configured to be used in a variety of applications, including but not limited to music search engines, music visualization, and deep audio compression technologies.

Another exemplary interface/manipulation process capable of being applied to the general MSML formalization involves audio compression using hierarchy repetitive structures in the MSML sound composition formalization (see, e.g., FIG. 5). This advanced phaseless repetition coding interface identifies structures formed by macro-repetition sound or audio primotrons in the highest level of an MSML formalization sound hierarchy to thereby provide further information/data quantity or bit rate reduction, without appreciably decreasing the overall information value or informativeness. Two types of data are used for the coding process: large scale data that defines the general structure within the MSML formalization and data that comprises original signal fragments described by a relatively lower level within the hierarchy. To compress the signal fragments, a general psycho-acoustic coder can be utilized, in some instances, possibly using an outer signal masking. Bit rate reduction occurs due to the elimination of repetitive fragments determined at the highest level of the MSML formalization hierarchy, while storing or otherwise maintaining the locations of these fragments. Perceptive equivalence of repetitive fragments may allow a reduction in the number of reference samples required for comparisons.

Yet another exemplary interface/manipulation process capable of being applied to the general MSML formalization involves audio bandwidth and bit rate reduction using a lossless compression interface for an MSML sound composition formalization (see, e.g., FIG. 6A) which may be configured to reduce the number of integer value arrays associated with the MSML formalization through the use of an advanced entropy coder performing only integer operations, without divisions and secondary probability estimations. Since the interface's range coder and contextual model don't use the mathematical operation of division, it allows the application of this interface to and/or execution of the interface by many low cost microcomputers that do not have a division operation. To improve the contextual model reliability of the interface, secondary probability estimation may be employed (see, e.g., FIG. 6B). Secondary probability estimation is a complex contextual model that utilizes predicted probability as a context to another model. That is, for example, secondary probability estimation may be implemented as one of the chaotic parameters relating different levels of the hierarchy together. In this regard, 2-dimensional secondary probability estimation can also be used for mixing two different models, wherein 2-dimensional secondary probability estimation is a modification of secondary probability estimation, which uses two input probabilities to determine a context. In some instances, additional integer contexts can also be used.

Still another exemplary interface/manipulation process capable of being applied to the general MSML formalization involves compression of audio signals for improving arithmetic coding and contextual modeling, to thereby increase compression ratios and processing speeds, and allow spectral data to be compressed with high effectiveness and higher speed. Such a compression method is capable of being fully automated and does not require pre-initialization for different types of audio data. It is sufficiently flexible to adjust for different sizes of spectral audio data, permitting it to be used with different spectral transforms. Instead of a standard arithmetic coder, a more efficient range coder is used. Context modeling is applied to the data stream, constructed algorithmic models, and the algorithmic optimization of a decoder function. This aspect is also at least partially based upon the use of adaptive range coder techniques which involve increasing the probability of the value coded. To improve the contextual model reliability, a secondary probability estimation may be employed.

Another exemplary interface/manipulation process capable of being applied to the general MSML formalization involves efficient audio data streaming using an audio data advanced accelerator interface for an MSML sound composition formalization, and utilizing a Null Quality Loss (NQL) process to reduce the number of quantized time-frequency spectral coefficients (QMDCT), to thereby provide faster delivery of the audio data without significant quality degradation in the resultant sound (see, e.g., FIGS. 7A and 7B). The NQL process performs a classification of sound structures within the MSML formalization depending on the importance thereof, in a comparison based, for example, on the limit or threshold of human perception. That is, for instance, there will be minimal, if any, information quality loss if the information quantity is reduced by data that is about or exceeds the limit or threshold of human perception. The advanced accelerator interface may be configured to reconstitute quantized time-frequency spectral coefficients of the initial format, without data de-quantization or reverse transcoding via PCM format. The advanced accelerator interface may, for example, divide the initially encoded file of time-frequency domain spectral coefficients into three groups, where coefficients from low frequency spectral groups are left unchanged, while some coefficients from intermediate frequency spectral groups may be zeroed using the NQL process, and coefficients from the third group (highest frequencies) may be eliminated by replacing them with the most similar sub-groups of coefficients, stitching them into low and intermediate groups, and saving a reference to this sought sub-group, as well as an integral factor, without affecting structural sound elements (harmonics and hits).

Another exemplary interface/manipulation process capable of being applied to the general MSML formalization involves reducing audio data file size (information quantity or bit rate), using an affine transforms coding interface for an MSML sound composition formalization (see, e.g., FIG. 8A), while preserving the integrity (information value) of the original audio data file. Such an interface may implement an affine transform of similar sound/audio primotrons, which leads to a decrease in signal entropy (i.e., higher structuring provides less entropy, and possibly a decrease in information quantity or bit rate). The affine transform interface associated with the MSML formalization may be used as an addition or supplement for any audio coding procedure, for example, as those disclosed herein, in order to increase the compression ratio thereof, as well as to provide a core compression process, for sound/audio signals where time-frequency domain, affine-similar micro-fragments are essential to the sound information value. This affine transforms coding interface, while capable of being used in conjunction with the MSML formalization, is configured to utilize similar spectral micro-fragments of the digital audio signal for increasing the compression ratio of that signal. During processing, the complete spectral range is split into sub-bands. A search for similar spectral fragments in the preceding part of the sound signal is performed independently and using a different step in each sub-band. Affine amplitude, time and spectral shift transform is used during the search for similar fragments. Each fragment found is subtracted from the original spectral fragment and the residual is further processed as a difference of spectral components, thus eliminating significant redundancy of spectral data, and thereby reducing the information quantity or bit rate in the process.

In practical terms (as illustrated, for example, in FIGS. 9-11), a digital audio file is represented by a bit matrix, which can then be appropriately analyzed for bit patterns representing various levels of informativity, and such basic bit patterns may be termed "primotrons" according to various aspects of the present disclosure addressed herein. Because the bit matrix can extend over multiple dimensions, and since the bit patterns can have different structures/combinations which can span more than one dimension of the bit matrix (i.e., provide various levels of informativity), the primotrons can be characterized as multi-structural, multi-level (MSML) objects or entities that provide a novel paradigm for the digital formalization of media such as sound or audio. Such a formalization procedure and the formalized digital audio file produced therefrom are disclosed in the present application, as well as various methods by which the primotrons may be identified or otherwise determined, and various methods by which such primotrons can be (re)combined or otherwise analyzed to synthesize a representation the original digital audio file that is within a threshold thereof. Since one aspect of the present disclosure involves reducing the information quantity or bit rate of the original digital media file, while retaining an information quantity within a threshold thereof, one skilled in the art will appreciate that additional benefits and advantages may be realized in terms of, for example, data transmission, data storage, data security, and the like, as detailed further herein.

Since a primotron, determined by aspects of a formalization method as disclosed herein, represents a pattern or combination of one or more bits or data elements in the various levels and/or dimensions of the bit matrix of the digital audio file, it follows that the digital audio file can subsequently be represented by a combination of such primotrons identified and/or otherwise determined to be included therein. That is, the digital audio file may be subject to MSML formalization, and then the MSML formalization may be analyzed to determine the combination of such primotrons or data elements present therein. Such an analysis may, for example, be characterized as a "living system" of interacting sound patterns under particular conditions within a bordered quantity of information. The evolution or "life history" of such patterns may be further characterized by principles of information evolution in a dynamic chaotic system defined by a finite number of structures, namely primotrons each having a "lifetime" which may vary from a fraction of a second to several minutes within the time or time-frequency duration of the digital audio file. Because the digital audio file is now represented by such a combination or living system of primotrons, wherein each primotron represents a bit subset of the bit matrix for or other structure or entity associated with that digital audio file, the MSML audio file including the identified combination of primotrons may exhibit, for example, a reduced data file size (information quantity) as compared to the original digitized audio file (while retaining an information quality of the digital audio file within a perceptive threshold of the original digital audio file). In some instances, such reduction may be, for example, on the order of about 20 times to about 60 times less than the original data file size, though the data file size reduction that may be achieved may be even greater than 60 times, for example, as further primotrons and associated methods are identified or otherwise determined and refined, wherein such primotrons may facilitate the reduction in information quantity or bit rate for the particular digital audio file, while retaining the informativeness of the digital audio file within a perceptive threshold of the original digital audio file. In other instances, it may be possible for a subset of the combination of primotrons or other data elements in the data file to be represented by yet a more general object or other entity, thereby further reducing the data file size as compared to the original digital audio file (and/or MSML formalization thereof). Accordingly, such a paradigm forms the basis of a highly structured, multi-functional digital data format configured for highly compact and effective storage and playback of any material represented in a faun of a harmonically-based or constructed high fidelity audio signal (including music, voice, and other rich sound-based media), within a threshold of the original digital data signal.

In identifying the various combinations of elements forming the various primotrons or other data elements, the resulting representative element may also be associated with particular parameters (i.e., referred to herein as chaotic parameters, or otherwise as a data file associated with particular characteristics of the representative element) representing, for example, the context or other characteristics of the representative element and/or the data elements or primotrons from which the representative element was determined. Such parameters may comprise, for example, relationships between data elements on the same level of the hierarchy, relationships between data elements across different levels of the hierarchy, relationships between data elements of a lower level hierarchy and their relationship to a data element in a higher level hierarchy. Further, since such primotrons are defined within a finite bordered quantity of information, the identified patterns associated with such primotrons may be associated with various corresponding aspects of the digital audio file. For example, certain primotrons may represent haimonics, while others may represent vocals, particular instruments, specific frequencies or frequency ranges, venue acoustics, or any other identifiable aspect of the digital audio file associated with a musical or other harmonic-based performance.

It thus follows that one aspect of the MSML (i.e., representation of the digitized audio file by a combination of primotrons) formalization of the digital audio file is that bits in the bit matrix that are not necessarily identified/determined as being a component of a primotron in the combination of primotrons, may be designated as noise (i.e., white noise or otherwise peripheral noise that is not necessarily significant to the nature of the digital audio file being converted to an MSML formalization (i.e., has a limited detrimental effect on the information quality of the digital audio file). In such instances, the noise may not be included in or may be otherwise removed from the MSML representation. However, there may be instances when some or all of the "noise" may be desirable for remaining included in the MSML representation. For example, in instances, where the digital audio file represents a live musical performance, some of the noise may be attributed to the acoustics of the performance venue or the reaction of the audience to the performance. As such, it may be desirable, in some instances, to include such "noise" with the MSML representation of the digital audio file so as to provide life, ambience, or otherwise a context to the audio file content. In doing so, the "desirable noise" may be separated into noise elements, with each noise element being represented by a respective peripheral primotron. In such a manner, one or more peripheral primotrons, or various combinations thereof, may be selectively included in the MSML representation. That is, such peripheral primotrons can be included in the MSML representation if necessary or desired, or otherwise removed from the MSML representation.

Another aspect associated with the foregoing is that, since the MSML representation of the original data file is in the form of a combination of primotrons or other data elements, and since peripheral primotrons may be identified/determined and selectively included in or excluded from the MSML representation, then it may be possible for one or more subcombinations of the combination of primotrons to be identified/determined and selectively included in or excluded from the MSML representation. For example, with respect to the aforementioned live musical performance, the combination of primotrons included in the MSML representation may include only the music from the instruments being played. In such instances, it may be possible, for instance, to identify the music from individual instruments such that the performance can be separated into "tracks" each associated with a respective instrument. Accordingly, simultaneous and timely-synchronized efficient aggregative processing of information relative and related to the audio signal and its traceable networked delivery, may be dynamically optimized over mobile and terrestrial IP infrastructure, wherein such MSML-represented audio files may be capable of simultaneously carrying and dynamically extracting both planar and volumetric signal representations in high definition (including, for example, 2.0 stereo and 5.1 surround sound) and within a single data file at a low bit rate, and may also be capable of real time extraction of a singing voice, at a sound quality fully transparent to and reproductive of the original sound source. Since one particular characteristic of MSML representations of digital audio files is a significantly lower information quantity or bit rate, having information value within a threshold of or even higher than the information quality of the original digital audio file, such exemplary capabilities disclosed herein may significantly lower expenditures related to digital storage, transmission, broadcast and bandwidth of media-centric systems and networks, while opening new revenue streams and increasing monetization of the content.

For example, another aspect associated with the capability of parsing the original audio data file or otherwise segregating the audio data file according to particular characteristics with respect to an MSML representation is that, in some instances, it may be possible to create or transfer particular secondary primotrons for selective inclusion in the MSML representation. For example, with respect to the aforementioned live musical performance, the characteristics of the acoustics of a different venue may be digitally captured or re-created and then converted to an MSML representation as one or more primotrons. In such instances, it may then be possible for the venue component to be removed from the MSML representation of the digital audio file, and then replaced with the primotron(s) associated with the different venue. One skilled in the art will thus appreciate that primotrons may be arranged in many different combinations to provide a desired MSML representation, whether or not the primotrons originated from the original digital audio file.

In furtherance to the concept of arranging primotrons in many different combinations to provide a desired MSML representation, one skilled in the art will also appreciate that primotrons or other data elements may be created to represent other entities within the MSML representation of the digital audio file. For example, one such primotron or other data element may be associated with unique indicia representing, for instance, the owner or possessor of the MSML representation of the digital audio file. More particularly, upon conversion of the digital audio file to MSML format, a unique combination of primotrons or other data elements may be generated to identify the particular user having the right to the MSML representation of the digital audio file, whether the user is, for instance, a content owner, a content licensee, a content purchaser, or otherwise an entity purchasing a right to access the content. In some cases, the unique indicia may be configured so as to remain a portion of the MSML representation (i.e., not "erasable" or otherwise removable) regardless of the manipulation of the manipulation of the MSML representation file by the user or subsequent possessor(s) thereof. Accordingly, as will be appreciated by one skilled in the art, the unique indicia may provide, in some instances, a "watermark" or otherwise a security feature for the particular MSML representation of the original digital audio file. Such a unique indicia may also, in some instances and whether configured to remain a portion of the MSML representation or not, be configured or arranged to represent other aspects of the MSML representation file, wherein such a unique indicia may comprise, for example, metadata (i.e., key word, reference, classification, security data, etc.), as will be appreciated by one skilled in the art.

In some instances, the unique indicia included in the MSML representation of the digital media file may be made apparent or otherwise monitored via a dedicated data channel configured to function in conjunction with the encoded harmonic signal to dynamically reflect and display interstructural information in the time domain, thus allowing synchronized playback audio with any outside or external events. For example, upon determining the primotron structure of a particular digital media file, the primotrons comprising the file, including the unique indicia, may be arranged in the time domain. With knowledge of the structure or particular characteristics of particular primotrons and the location thereof in the time domain in association with the time duration of the digital media file, such knowledge can be used to drive certain events or to have certain occurrences of information associated therewith. Such external events may include, for example, video or a programming sequence in a game or movie, song lyrics, cover art, artist and composer credentials or sheet music, various visual and pyrotechnic special effects including indoor and outdoor lighting or visual audiobook, targeted advertising or to any other information related to the played sound media. That is, for instance, a primotron or combination of primotrons may be designated within the dedicated data channel as driving a particular external event or effect. When the dedicated data channel has the MSML formalized audio file combined therewith or otherwise introduced thereto, the occurrences of particular primotrons or combinations thereof along the time duration of the MSML formalized audio file serves to drive the corresponding external event or effect at the particular time during the execution of the MSML formalized audio file, thereby increasing informativeness and personalization of the received media, and substantially enhancing the entertainment value and monetization thereof.

More particularly, with respect to the dedicated data channel aspect, during the encoding and conversion process of raw audio data (PCM, way, aiff) and high bit rate MP3, AAC, OGG, WMA (i.e., about 192 kbit/sec and higher) files into the MSML formalization, a set of structures having unique properties and characteristics representing the audio data are identified and extracted (i.e., primotrons and multiple level descriptions using same). Representing the audio data in such a manner allows an intelligent fully integrated interactive data channel to be provided in association with the MSML formalization. For example, the data channel may be configured to include a variety of information about and associated with the MSML formalization of the audio or other media data. More particularly, the data channel may be configured to receive data indicative of one or more events associated with a particular primotron and/or multiple level description element in the MSML formalization. In other instances, the data may be generally associated with the overall music composition. For instance, such an event may include an audio and/or sonic attribute associated with a note, one or more lyrics with particular timing and duration associated with a word, "sheet music" associated with the music composition, licensing identification, copyright and legal information along with a variety of subordinate data, such as links to other audio, imaging and video options, related text materials, including news, events, or the like.

In one example, a sound composition may be processed into the associated MSML formalization, including the aforementioned primotrons and multiple level descriptions. In preparing the MSML formalization, the corresponding data file may be configured to have the data therein capable of communication with external data (i.e., the data file may be configured to communicate with the "data channel"). Such external data may be configured to relate a particular primotron, a particular multiple level description, or combinations thereof, with a particular action, event, effect, etc. For instance, the external data may be configured to execute operation of decorative water fountains. Accordingly, various characteristics of the sound composition may be correlated with various operational characteristics of the water fountains. In particular aspects, for example, the volume along the time duration of the sound composition may be correlated with the volume or pressure of the water directed through one or more of the fountains; various instruments may be correlated with various subgroups of the fountains; lyrics may be correlated and timed with lights illuminating the various fountains. Accordingly, the various primotrons and multiple level descriptions determined from the MSML formalization for the particular sound composition may be automatically configured to drive of otherwise affect the particular application. As such, the particular application may be readily changed by merely associating an MSML formalization of a different sound composition with the particular application via the dedicated data channel. A similar example can be tied to pyrotechnics, such as, for instance, in a fireworks display. As such, when configured in this manner, the sound composition is used to "drive" the particular application by the very nature of the MSML formalization of that sound composition. That is, the particular configuration of the data channel may remain the same (i.e., certain primotrons or combinations thereof drive particular corresponding external events), but changing the sound composition results in a different MSML formalization associated with that particular sound composition and, because primotron events will occur at different instances throughout the time duration than another sound composition, the external events associated with the data channel will be driven in a different sequence than with a different sound composition. Accordingly, the MSML formalization of one sound composition can simply be replaced with an MSML formalization of another sound composition in order to affect a change in the particular application, for example, a video game based on characteristics of a musical composition (i.e., a karaoke-based video game). Such a schema sharply contrasts with the state of the art in which each sound composition would have to be analyzed and individual events associated with the particular application would have to be correlated with particular aspects of that sound composition, in a very time-consuming process. In order to change the sound composition in such instances, the painstaking manual correlation process would again have to be repeated.

One skilled in the art will also appreciate that the data channel concept may also have further capabilities with respect to cooperation with an MSML formalization. For example, a particular sound composition may, in some instances, have corresponding lyrics and/or video associated therewith. As disclosed, the sound composition may be represented by an MSML formalization in accordance with the various aspects of the present disclosure as detailed herein. In some instances, the lyrics and/or the video may be correlated with the primotron profile of the sound composition in the time domain or time-frequency domain. That is, particular occurrences within the lyrics and/or the video may be associated with the time domain primotron profile of the sound composition. As such, interaction between the MSML formalization of the sound composition and the data channel having the lyrics and/or video associated therewith, may present a situation in which the profiles therebetween can be correlated (i.e., according to a time-domain occurrence of particular primotrons or combinations thereof). In performing the correlation, the MSML formalization of the sound composition essentially becomes synchronized with the lyrics and/or video associated with the data channel due to the correspondence of the time domain primotron profiles. Accordingly, in some instances, dynamic synchronization may be achieved or realized, since correlation between the data channel and the MSML formalization of the sound composition essentially in real time. One practical implication is, for example, that the MSML formalization of the sound composition may be in the process of being performed or executed, and can be brought into interaction with the data channel at any time in that duration, wherein, upon such interaction, the video and/or lyrics associated with the data channel may become dynamically synchronized with the sound composition essentially in real time. This may, for instance, allow at-will engagement and disengagement of the data channel with the MSML formalization of the sound composition, without having to resort to the time origin (i.e., in order to perform the correlation.

In some aspects, the external data associated with the data channel may be directed to a special repository or location within the data file of the MSML formalization of the sound composition. In such a manner, the external data may be implemented prior to and commensurately with the sound synthesized and played from the MSML formalization of the sound composition. Accordingly, an appropriate playback aspect may be configured to provide access to the collected sound information (external data) repository, and may be configured to receive desired content (i.e., different sound and/or video compositions) via the dedicated data channel, and in full synchronicity therebetween, while simultaneously decoding sound data to create an enriched interactive-content user experience. Such aspects allow creation of a multi-dimension intelligent music and related applications including, but not limited to a variety of interactive music and video services, and games where users and environments will interact with the medium and each other (i.e. a new way of experiencing music by providing users with premium interactive content for personalized playback experiences, for example, where the music drives or otherwise controls the experience).

The data channel may be comprised of data gathered during the MSML formalization and synthesis process of the same sound composition/digital audio data and any external information linked to the sound composition, and may be configured to incorporate desired information into the MSML formalization during a corresponding encoding process or as a post processing addition of an already-encoded MSML formalization in accordance with but not limited to the following structure.

That is, in some aspects, the noted data channel may include several types of informational data related to external events and/or in correspondence with an MSML formalization of a sound composition configured to interact therewith, wherein one example is as follows:

General:
  Basic—data encoded both at the file header and each block (typically at an interval of 10 sec) identifying playing content, and who has encoded and decoded the original file and all corresponding advanced information:

Song ID—unique song or audio composition identifier, by which any additional information of the song can be received from a computing cloud repository
LDE
  Encoder ID
  Decoder ID
  License validity period
  Song name
  Album name
  Artist name(s)
  Overall number of patterns
  Overall number of repetitions
Advanced
  Internal
    Block
    Frame
  External
    Primary
    Secondary
General data representing the following information:
  Advanced (data encoded at the file header)
    Song identifying data:
      Track number within the album, disk number (for multi disk collection), gap or gapless album
      Music genre, music sub genre, style
      Primary composition or remix
      Performance primary language(s)
    Copyright:
      Copyright holder name
      Release date
      License type
      License duration (start and expiration date)
      Region of the license applicability
      Recording studio name
    Credentials:
      Author of the music (music composer(s))
      Author of the song lyrics
      List and total number of various instruments used to create the song and their respective ID within the track
      Each instrument artist (i.e. all artists names who played instruments mentioned in the General information)
      Audio engineer(s)
      Artwork graphic designer
    Technical characteristics:
      Song format (mono, stereo, multichannel 5.1, etc.)
      Output file characteristics: Discretization (44.1/48/96/192 KHz), Bit depth resolution (16/24/32)
      Deviation of sound volume level against average (i.e., how much the song level has to be adjusted to provide consistent level within the song and/or to provide equal level continuous playback between various songs)
Internal:
  per Block:
    Basic data
    Rhythm
    Tempo
    Stereo signal definitions
    Time-Frequency mask and other information by which user can filter out specific instrument(s) from the mix
    Melody definitions:
      Type of scale
      Time stamped link(s) to remote information (audio, video, text) and their correspondent duration
      Time stamped sonic characteristics and their correspondent duration:
      Hits with corresponding brightness
      Harmonicity:
        Instrument identification and corresponding volumetric space definitions
        Each instrument proportion within the mix and within particular channel, including time delay, etc.
        Overall number of the instruments in the block
        Voice/Instrument definition
        Vowel
        Consonant
        Dissonant harmonies
        Pitch classes
      Music Events:
        Average Loudness level (AVL)
        Loudness Level increase
        Loudness Level decrease
        Scale acceding sequence
        Scale descending sequence
        Tone attack
        Tone decoy
        Tone duration
        Tone pitch
        Tone intensity (loudness)
        Tone Thimble (or quality)
        aperiodic aspects:
          attack transients
          vibrato
          envelope modulation
      Patterns and Repetitions
        Number of patterns per block
        Pattern identification
        Number of repetitions per block
        Repetition identification
      Primary Language Lyrics
  per Frame:
    Composition characteristics:
      Song lyrics:
      Time location and duration of each word of the lyrics through out the frame
    Location of the hits
    Characteristics of hits:
      brightness
      duration
    Scale steps
    location of high harmonically structured sound scenes
    level of harmonicity
    level of signal purity
    location of harmonics repetitions
    location for each specific pattern
External:
  Primary (information stored, e.g., at computing cloud music repository)
    General information
    Corresponding artwork
    Additional slides
    Content audio fingerprint
    Song sheet music
  Secondary (information stored e.g., externally to computing cloud music repository)
    any text along with its time synchronization and duration of visibility of the text through the song (fragment)
    any link along with its time synchronization and duration of its visibility through out the song (fragment)

In practical terms, the dedicated data channel may help to increase the versatility of the MSML formalization of the digital audio file. More particularly, within the MSML formalization scheme, the characterization of the audio (or video, in some aspects) data allows objective representations of that data to act as a proxy under the MSML formalization. More particularly, the relatively limited amount of objective representations, as well as the particular definitions of those representations, allows various combinations of those representations to be arranged in a manner that reflects the configuration of the original audio data (i.e., the audio data is represented by various combinations within the known set of objective representations, which provides a defined universe for characterizing any sound composition). In this manner, the MSML formalization procedure and structure minimizes or otherwise removes subjective or non-standard criteria encountered when conventionally analyzing sound from a wave perspective.

The defined universe of objective representations further allows sound compositions to be de-constructed into individual elements (i.e., instruments, lyrics, etc.), wherein such elements can be included, removed, replaced, or otherwise manipulated as desired. In some aspects, a sound composition can be formed using the MSML-formalized objective representations as the "building blocks" or basis of the composition. Further, external data, such as metadata, security information, copyright material, etc, may be added to the MSML formalization, wherein such external data, while in digital form, may be provided with objective representations that may be distinguished from the objective representations of the sound composition. In this manner, the external data may be synthesized, implemented, analyzed, or otherwise manipulated, without disrupting or otherwise affecting the characteristics of the sound composition itself (i.e., the external data may be configured so as to be objectively distinguishable from the data representing the MSML-formalized sound composition).

In particular aspects, the objective representations realized by the MSML formalization may be useful, for example, in objectively analyzing various sound compositions (i.e., as a "copyright forensics" tool), or as a driver or other associated component of a "driven" system (i.e., a pyrotechnics display, a dynamic fountain arrangement, a video game, etc.). That is, the objective representations may be tied to or otherwise configured to actuate corresponding functions that may be defined via the association with external data. The aforementioned dedicated data channel may be used to introduce a sound composition to the defined functions (in an MSML-formalized fauna°, or vice versa, within the harmonic structure of the MSML-formalized representation of the sound composition.

In other aspects, the MSML formalization of the sound composition, resulting in objective representations of the sound composition, may facilitate an element-based event scheme, which may not necessarily be based on, but could include, a time-dependent aspect. Since the scheme is element/event driven, various audio characteristics (i.e., tempo, beats, bars, real-time synchronicity, audible events, emotional events, etc.) could be represented in a more objective manner, and thus manipulated in a similar manner to the basic components of the sound composition.

In some aspects, the aforementioned unique indicia that may be included as part of the external data may prevent manipulation of the MSML representation by anyone other than the user. In other aspects, the unique indicia may serve to identify the user (i.e., the particular user having the right to the particular MSML representation) in instances where such a file is copied, transferred, or otherwise distributed by the user. Such a feature may, in some instances, limit or eliminate copying, file sharing, or otherwise unauthorized use of the particular MSML representation of the original digital audio file. In other instances, such a feature may serve as a mechanism for "tracking" the user, including, for example, purchasing habits or trends, demographics, or use of the data (and usage trends), or as a mechanism for directing bills or invoices to the user for purchase, authorized use of, or permitted access to the MSML representation. Accordingly, the unique indicia may, in some instances, function within the MSML format space to provide traceable data files that can be attributed to the particular user having certain rights therein, wherein such functionality may facilitate increased efficiency and secure revenue for the content owner by limiting or otherwise dissuading unauthorized re-distribution of the data file, whether or not in MSML format. Accordingly, an MSML representation may be configured to extract a unique sound fingerprint from an analog audio signal which, along with inaudible data embroidering, may provide a highly effective and secure method of digital media identification and traceability, without regard to or dependence upon format transformations and delivery methods.

Many modifications and other aspects of the disclosures set forth herein will come to mind to one skilled in the art to which these disclosures pertain having the benefit of the teachings presented in the foregoing descriptions and the associated drawings. For example, the aspects disclosed herein may, in some instances, be referred to as an indicia of a multi-functional digital data format configured for highly compact and effective storage and playback of any material represented in a form of a harmonically-based or harmonically-constructed high fidelity signal (including music, voice, and other rich sound-based media), with simultaneous and timely-synchronized efficient aggregative processing of information relative and related to the signal and its traceable networked delivery, dynamically optimized over mobile and terrestrial IP infrastructure. Such media files may be capable of simultaneously carrying and dynamically extracting both planar and volumetric signal representations in high definition (including, for example, 2.0 stereo and 5.1 surround sound) and within a single data file at a low bit rate (i.e., a single data file having a reduced information quantity), and may also be capable of real time extraction of a singing voice, at a sound quality fully transparent to and reproductive of the original sound source (i.e., with high information quality). Such capabilities may significantly lower expenditures related to digital storage, broadcast, transmission, and bandwidth of media-centric systems and networks, while opening new revenue streams and increasing monetization of the content. In this regard, such media may be configured to extract a unique sound fingerprint from the analog signal which, along with inaudible data embroidering, may provide a highly effective and secure method of digital media identification and traceability, without regard to or dependence upon format transformations and delivery methods. Such media may also be configured to include a dedicated data channel meshed and blended with the harmonic signal to dynamically reflect and display inter-structural information of the signal in the time domain or time-frequency domain, thus allowing synchronized playback audio with any outside or external events (wherein such an event may include, for example, video or a programming sequence in a game or movie, song lyrics, cover art, artist and composer credentials or sheet music, various visual and pyrotechnic special effects including indoor and outdoor lighting or visual audiobook, targeted advertising or to any other information related to the played sound media) by two-way data interaction. The data channel substantially increases informativeness (i.e., information value) and personalization of the received media, thus substantially enhancing the entertainment value and monetization thereof.

In addition to the methods disclosed herein, one skilled in the art will also appreciate that the disclosed methods may be embodied in an executable by appropriate devices and systems such as, for example, various devices capable of cooperating via corresponding processors or other computing and communication devices, wherein such devices may be associated with particular memory or storage provisions where necessary, desired, and/or appropriate. One skilled in the art will further appreciate that the disclosed methods may be embodied in at least one computer-readable storage medium having computer-readable program code portions stored therein that, in response to execution by a processor, cause an apparatus to at least perform the disclosed methods. Therefore, it is to be understood that the disclosures are not to be limited to the specific aspects disclosed and that modifications and other aspects are intended to be included within the scope of the appended claims. Although specific terms are employed herein, they are used in a generic and descriptive sense only and not for purposes of limitation.

What is claimed is:

1. A method of structuring information, comprising:
analyzing an original digital information file to determine an original information quantity and an original information value associated therewith;
applying an initial manipulation process to the original digital information file to form a first resulting digital information file, and applying a subsequent manipulation process to the first resulting digital information file to form a second resulting digital information file, each manipulation process being configured to at least one of remove at least one element of the processed digital information file, or represent a combination of a plurality of elements of the processed digital information file with a representative element and a first indicia associated with an interrelationship between the representative element and at least one of the plurality of elements in the combination, so as to reduce the information quantity of and to structure the processed digital information file, the at least one of the removed element and the representative element being determined to reduce the information value of the processed digital information file by no more than a selected threshold; and
successively applying manipulation processes to the previously resulting digital information file until successive manipulation process applications do not achieve a threshold reduction in the information quantity in the subsequent resulting digital information file over the previously resulting digital information file, the last resulting digital information file thereby having a primary structure with a reduced information quantity with respect to the original information quantity and a resulting information value within the selected threshold of the original information value.

2. A method according to claim 1, wherein successively applying manipulation processes further comprises successively applying manipulation processes to the previously resulting digital information file to form the last resulting structured digital information file configured according to an information hierarchy having a plurality of information levels.

3. A method according to claim 2, wherein a higher information level of the information hierarchy includes a smaller information quantity than a lower information level, and wherein the method further comprises one of:
forming the higher information level from a structure of the lower information level and chaotic parameters associated therewith;
forming the higher information level such that the higher information level includes a higher information value than the original information value; and
forming a plurality of lower information levels from a structure of the higher information level, and selecting one of the plurality of lower information levels for association with the higher information level.

4. A method according to claim 1, further comprising simultaneously applying a plurality of manipulation processes to a previous digital information file so as to form a secondary structured digital information file.

5. A method according to claim 4, further comprising analyzing the primary and secondary structured digital information files so as to determine at least one of an interrelationship between information levels within one of the primary and secondary structured digital information files, or an interrelationship between the primary and secondary structured digital information files.

6. A method according to claim 1, further comprising applying at least one of a plurality of manipulation processes to a previous digital information file, the manipulation processes being selected from the group consisting of a phaseless coding manipulation process, a structured analysis manipulation process for repetitive structures, a phaseless repetition coding manipulation process, a lossless entropy compression manipulation method, a loss-less accelerator manipulation process for forming an additional compression layer for a previously reduced audio data file, an accelerator manipulation process for facilitating efficient audio data streaming, and an affine transforms coding manipulation process.

7. A method according to claim 1, wherein successively applying manipulation processes to obtain a resulting information value within the selected threshold of the original information value further comprises successively applying manipulation processes to obtain a resulting information value within the selected threshold, comprising a limit of human perception, of the original information value to preserve fidelity of the primary structured digital information file.

8. A method according to claim 1, wherein forming the resulting digital information files, further comprises forming the resulting digital information files such that each resulting digital information file comprises a set of objects and object clusters, each object and object cluster having a respective definition, and wherein applying a manipulation process to at least one of remove at least one element of the processed digital information file, or represent a combination of a plurality of elements of the processed digital information file with a representative element, further comprises applying a manipulation process to at least one of remove at least one element of the processed digital information file, or represent a combination of a plurality of elements of the processed digital information file with a representative element, a first indicia associated with an interrelationship between the representative element and at least one of the plurality of elements in the combination, and a second indicia associated with an interrelationship between at least two of the plurality of elements in the combination.

9. A method according to claim 8, wherein forming the resulting digital information files, further comprises forming the resulting digital information files such that the objects and object clusters therein comprise at least one of the representative elements and such that the definition associated with each object and object cluster comprises the first interrelationship indicia, and optionally the second interrelationship indicia, associated with the at least one of the representative elements.

10. A method according to claim 9, further comprising one of:
including the definitions with the corresponding set of objects and object clusters in each resulting digital information file; and
maintaining the definitions associated with the set of objects and object clusters separately from each corresponding resulting digital information file.

11. A method according to claim 1, wherein forming the resulting digital information files, further comprises forming the resulting digital information files such that each subsequent resulting digital information file comprises any recognized patterns of objects and object clusters within the previous resulting digital information file.

12. A method according to claim 1, wherein successively applying manipulation processes until successive manipulation process applications do not achieve a threshold reduction in the information quantity in the subsequent resulting digital information file, further comprises successively applying manipulation processes until successive manipulation process applications do not achieve a threshold reduction in the information quantity in the subsequent resulting digital information file, such that the last resulting digital information file has an information primotron structure comprising a set of primary objects, primary object clusters, and any interrelationships associated therewith.

13. A method according to claim 12, further comprising analyzing each successive resulting digital information file and the last resulting digital information file so as to determine statistical correlations between subsequent objects in a subsequent digital information file and previous combinations of objects in a previous digital information file and, for any statistical correlation at least meeting a correspondence threshold, storing a correlation indicia of the corresponding subsequent object and previous combination of objects for analysis of a subsequent original digital information file.

14. A method according to claim 12, further comprising one of:
analyzing each successive resulting digital information file so as to determine at least one objective correlation between a combination of previous objects, and at least one interobject relationship between the previous objects in the combination, in a previous digital information file and associating the at least one objective correlation and the at least one interobject relationship with a corresponding subsequent object in a subsequent digital information file, the at least one objective correlation and the at least one interobject relationship associated with the corresponding subsequent object, over a plurality of subsequent objects, collectively forming a set of object correlations representative of the interrelationships associated with the set of primary objects and primary object clusters in the information primotron structure; and
analyzing each successive resulting digital information file so as to determine at least one objective correlation between a combination of previous objects in a previous digital information file, and assigning at least one interobject relationship between previous objects in the combination, and associating the at least one objective correlation and the at least one interobject relationship with a corresponding subsequent object in a subsequent digital information file, the at least one objective correlation and the at least one interobject relationship associated with the corresponding subsequent object, over a plurality of subsequent objects, collectively forming a set of object correlations representative of the interrelationships associated with the set of primary objects and primary object clusters in the information primotron structure.

15. A method according to claim 14, further comprising interpreting the set of primary objects and primary object clusters in the information primotron structure by statistically evaluating various combinations of the object correlations in the set of object correlations and, for any combination of the object correlations at least meeting a statistical threshold, associating the combinations with the primary objects and primary object clusters as a contextual interpretation of the set of primary objects and primary object clusters in the information primotron structure.

16. A method according to claim 15, further comprising synthesizing a representative digital information file associated with the original digital information file by applying the contextual interpretation to the set of primary objects and primary object clusters in the information primotron structure.

17. A method according to claim 14, further comprising:
associating at least one object, the at least one object being selected from the previous objects, the subsequent objects, and the primary objects and primary object clusters, with one of a plurality of characteristics of the original digital information file; and
determining an arrangement of the plurality of characteristics with respect to a time duration of the original digital information file and correlating a distribution of the at least one object with respect thereto.

18. A method according to claim 17, further comprising forming a summary data file including a generalized representation of the distribution of the at least one object associated with each of the plurality of characteristics over the time duration of the original digital information file.

19. A method according to claim 12, wherein successively applying manipulation processes until successive manipulation process applications do not achieve a threshold reduction in the information quantity in the subsequent resulting digital information file, further comprises cataloging an amount and an order of the manipulation processes successively applied to the subsequent resulting digital information files to obtain the last resulting digital information file having the information primotron structure, the amount of manipulation processes being associated with corresponding tiers of an information hierarchy.

20. A method according to claim 12, further comprising synthesizing a representative digital information file associated with the original digital information file according to a conditional process comprising:
applying any applicable correlation indicia to the set of primary objects and primary object clusters in the information primotron structure to determine the corresponding previous combination of objects associated therewith;
if no applicable correlation indicia is determined, applying the contextual interpretation to the set of primary objects and primary object clusters in the information primotron structure to determine the corresponding previous combination of objects associated therewith; and if the application of the contextual interpretation is below a threshold information value associated with the original information value, applying an initial reverse manipulation process to the set of primary objects and primary object clusters in the information primotron structure, the initial reverse manipulation process being the first manipulation in the reverse order of the manipulation processes, to determine the corresponding previous combination of objects associated therewith.

21. A method according to claim 20, further comprising, for the previous combination of objects determined from the set of primary objects and primary object clusters in the information primotron structure, applying thereto the conditional process including any applicable correlation indicia, the corresponding contextual interpretation, or the next reverse manipulation process in the reverse order of the manipulation processes corresponding to the previous combination of objects, in order to determine a next previous combination of objects corresponding thereto.

22. A method according to claim 21, further comprising successively applying the conditional process to the next previous combination of objects until the resulting previous combination of objects is associated with the initial tier of the information hierarchy, the resulting previous digital information file thereby corresponding to the synthesized representative digital information file.

23. A method according to any of claim 1, wherein the original digital information file is a digital audio file, and the method further comprises associating an information quantity of the digital audio file with a bit rate proportional to a size and a time duration of the digital audio file, and associating an information value of the digital audio file with a quality of the digital audio file, the quality being determined from at least one of a primotron energy threshold value, a Perceptive Information Criteria (PIC), a sound structure identified from a random chaos fluctuation event determined according to a probability distribution function using random noise as an input signal, a Null Quality Loss criteria, or a surface area of an n-dimensional sphere of a single unit radius in a time frequency domain determined from an implicit function.

24. A method according to claim 23, wherein successively applying manipulation processes to the previously resulting digital audio file to form the last resulting structured digital music file further comprises successively applying manipulation processes to the previously resulting digital audio file to form the last resulting structured digital audio file configured according to an information hierarchy having a plurality of information levels, wherein a lower information level comprises a representation of the audio as a high resolution digital information file, and a higher information level comprises a sheet representation including a written note score with correspondent lyrics, the higher information level thereby having a smaller information quantity than the lower information level, and the lower information level thereby being capable of being formed from the higher information level and chaotic parameters associated with performance and digitization of the audio according to the sheet representation.

25. A method according to claim 24, wherein successively applying manipulation processes to the previously resulting digital audio file to form the last resulting structured digital music file further comprises successively applying manipulation processes to the previously resulting digital audio file to form the last resulting structured digital audio file comprising at least one primotron defined in one of a time domain and a time-frequency domain, the last resulting structured digital audio file thereby representing a compact digital formalization of a harmonic signal, wherein the information quantity associated with the audio bit rate is reduced compared to the digital audio file corresponding to the original digital information file, while the information value associated with the audio quality is maintained within a threshold of the digital audio file corresponding to the original digital information file.

26. A method in according to claim 23, wherein each digital audio file represents harmonic-related data, and the method further comprises defining hits as time-domain higher level hierarchical structures; defining harmonics as frequency-domain higher level hierarchical structures having a subsequent harmonic primotron origination coinciding with a previous harmonic primotron termination; eliminating redundancy in time-domain lower level hierarchical structures to obtain a decrease in entropy in the higher level hierarchical structures; and defining overtones as frequency-domain higher level hierarchical structures having a single base frequency corresponding to the lower level hierarchical structures and a plurality of copies the higher level hierarchical structures shifted by a fixed frequency from the single base frequency and each other.

* * * * *